United States Patent
Yeo et al.

(10) Patent No.: US 9,978,746 B2
(45) Date of Patent: May 22, 2018

(54) SEMICONDUCTOR DEVICES AND METHODS OF MANUFACTURING THE SAME

(71) Applicants: Kyoung Hwan Yeo, Seoul (KR); KeunHee Bai, Suwon-si (KR); Seungseok Ha, Hwaseong-si (KR); Eunsil Park, Suwon-si (KR); Sunhom Steve Paak, Seoul (KR); Heonjong Shin, Yongin-si (KR); Dongho Cha, Seongnam-si (KR)

(72) Inventors: Kyoung Hwan Yeo, Seoul (KR); KeunHee Bai, Suwon-si (KR); Seungseok Ha, Hwaseong-si (KR); Eunsil Park, Suwon-si (KR); Sunhom Steve Paak, Seoul (KR); Heonjong Shin, Yongin-si (KR); Dongho Cha, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 5 days.

(21) Appl. No.: 15/059,423

(22) Filed: Mar. 3, 2016

(65) Prior Publication Data
US 2016/0307890 A1  Oct. 20, 2016

(30) Foreign Application Priority Data
Apr. 14, 2015  (KR) ........................ 10-2015-0052555

(51) Int. Cl.
*H01L 27/088* (2006.01)
*H01L 29/06* (2006.01)
(Continued)

(52) U.S. Cl.
CPC ........ *H01L 27/088* (2013.01); *H01L 27/1104* (2013.01); *H01L 29/0653* (2013.01); *H01L 21/823481* (2013.01); *H01L 27/0886* (2013.01)

(58) Field of Classification Search
CPC ............. H01L 21/3141; H01L 21/3212; H01L 21/8234; H01L 21/336; H01L 21/823431;
(Continued)

(56) References Cited

U.S. PATENT DOCUMENTS 5,617,351 A     4/1997  Bertin et al.
5,780,346 A *   7/1998  Arghavani ........ H01L 21/76235
                                        148/33.3
(Continued)

FOREIGN PATENT DOCUMENTS

JP    2010530623 A    9/2010
JP    2010272859 A   12/2010
(Continued)

*Primary Examiner* — Angel Roman
*Assistant Examiner* — Kevin Quinto
(74) *Attorney, Agent, or Firm* — Myers Bigel, P.A.

(57) ABSTRACT

Provided is a semiconductor device with a field effect transistor. The semiconductor device may include a substrate including an active pattern, a separation structure crossing the active pattern and dividing the active pattern into first and second region. The separation structure may include a first insulating pattern that fills a recess region between the first and second regions. The first insulating pattern may have a concave top surface.

20 Claims, 42 Drawing Sheets

(51) Int. Cl.
*H01L 27/11* (2006.01)
*H01L 21/8234* (2006.01)

(58) Field of Classification Search
CPC . H01L 21/845; H01L 27/1104; H01L 27/088; H01L 29/435; H01L 27/0886; H01L 51/0508
USPC ....... 257/192, 218, 288, 396, 347, 350, 359, 257/401, 649, 722, 762
See application file for complete search history.

(56) References Cited

U.S. PATENT DOCUMENTS

| | | | |
|---|---|---|---|
| 5,943,585 A * | 8/1999 | May | H01L 21/76237 257/E21.551 |
| 6,054,343 A * | 4/2000 | Ashburn | H01L 21/76224 257/506 |
| 6,825,528 B2 * | 11/2004 | Iwata | H01L 21/2251 257/336 |
| 7,176,526 B2 * | 2/2007 | Iwata | H01L 21/2251 257/346 |
| 7,888,233 B1 | 2/2011 | Gauri et al. | |
| 7,923,337 B2 | 4/2011 | Chang et al. | |
| 8,084,308 B2 | 12/2011 | Chang et al. | |
| 8,237,228 B2 | 8/2012 | Or-Bach et al. | |
| 8,609,510 B1 | 12/2013 | Banna et al. | |
| 8,624,326 B2 | 1/2014 | Chen et al. | |
| 8,735,991 B2 | 5/2014 | Shieh et al. | |
| 8,846,491 B1 | 9/2014 | Pham et al. | |
| 8,878,309 B1 | 11/2014 | Hong et al. | |
| 8,957,481 B2 | 2/2015 | Zhu et al. | |
| 8,969,999 B2 | 3/2015 | Liang et al. | |
| 9,312,181 B2 * | 4/2016 | Choi | H01L 27/0886 |
| 2016/0049394 A1 | 2/2016 | Shin et al. | |
| 2016/0111524 A1 | 4/2016 | Ha et al. | |

FOREIGN PATENT DOCUMENTS

| | | |
|---|---|---|
| KR | 20130043543 A | 4/2013 |
| KR | 20130046338 A | 5/2013 |
| KR | 20160028070 A | 2/2016 |

* cited by examiner

2000

3000

SEMICONDUCTOR DEVICES AND METHODS OF MANUFACTURING THE SAME

CROSS-REFERENCE TO RELATED APPLICATIONS

This application claims priority under 35 U.S.C. § 119(a) from Korean Patent Application No. 10-2015-0052555, filed on Apr. 14, 2015, in the Korean Intellectual Property Office, the disclosure of which is hereby incorporated by reference in its entirety.

BACKGROUND

Due to their small-sized, multifunctional and/or low-cost characteristics, semiconductor devices are being spotlighted as important elements in the electronic industry. The semiconductor devices may be classified into a memory device for storing logic data, a logic device for processing the logic data and a hybrid device including both memory and logic elements. To meet the increased demand for electronic devices with fast speed and/or low power consumption, it may be beneficial to realize semiconductor devices with high reliability, high performance, and/or multiple functions. To satisfy these technical requirements, complexity and/or integration density of semiconductor devices may be increased.

SUMMARY

According to example embodiments of the inventive concept, a semiconductor device may include a substrate including an active pattern, and a separation structure that crosses the active pattern and that divides the active pattern into first and second region. The separation structure may include a first insulating pattern in a recess region that is between the first and second regions, and the first insulating pattern may have a concave top surface.

In example embodiments, a center of the concave top surface of the first insulating pattern may be positioned at a lower level than both edges thereof.

In example embodiments, the separation structure further includes a second insulating pattern that is on the first insulating pattern.

In example embodiments, the second insulating pattern is on the concave top surface of the first insulating pattern, and an upper width of the second insulating pattern may be greater than a width of the first insulating pattern.

In example embodiments, the semiconductor device may further include an interlayer insulating layer on the active pattern on the substrate. A top surface of the second insulating pattern may be coplanar with a top surface of the interlayer insulating layer.

In example embodiments, the second insulating pattern and the interlayer insulating layer may include a same material.

In example embodiments, the semiconductor device may further include contacts that are adjacent the separation structure and that are electrically connected to each of the first and second regions. The contacts penetrate both edges of the second insulating pattern.

In example embodiments, the semiconductor device may further include a device isolation layer that defines the active pattern on the substrate. The first insulating pattern may extend on the device isolation layer along a first direction that is parallel to a top surface of the substrate.

In example embodiments, an upper portion of the active pattern protrudes on the device isolation layer, and a bottom surface of the recess region is positioned at a lower level relative to the substrate than a top surface of the device isolation layer.

In example embodiments, the semiconductor device may further include first and second gate electrodes that cross the first and second regions, respectively. The separation structure may extend in parallel between the first and second gate electrodes.

In example embodiments, the concave top surface of the first insulating pattern may be positioned at a lower level than top surfaces of the first and second gate electrodes and may be positioned at a higher level than a top surface of the active pattern.

In example embodiments, the separation structure may further include spacers on opposite sidewalls of the first insulating pattern. A center of the concave top surface of the first insulating pattern may be positioned at a lower level than top surfaces of the spacers.

In example embodiments, a bottom surface of the first insulating pattern may be positioned at a lower level relative to the substrate than bottom surfaces of the spacers, the spacers are on the opposite sidewalls of the first insulating pattern.

In example embodiments, the separation structure may further include a conductive pattern on the first insulating pattern.

In example embodiments, the active pattern may include a plurality of active patterns. The semiconductor device may further include a third gate electrode that crosses at least one of the active patterns. The third gate electrode may be aligned in one direction with the separation structure, and the one direction may be an extending direction of the gate electrode and the separation structure. One end of the conductive pattern may be connected to one end of the third gate electrode.

According to example embodiments of the inventive concept, a semiconductor device may include gate electrodes that cross active patterns on a substrate and a separation structure that cross the active patterns between a pair of the gate electrodes. The separation structure may include a first insulating pattern that penetrates the active patterns and that extends toward a bottom surface of the substrate. A top surface of the first insulating pattern may be positioned at a lower level than top surfaces of the gate electrodes, and may be positioned at a higher level than top surfaces of the active patterns.

In example embodiments, a center of the top surface of the first insulating pattern may be positioned at a lower level than both edges thereof.

In example embodiments, the semiconductor device may further include an interlayer insulating layer on the active pattern on the substrate. The top surface of the first insulating pattern may be positioned at a lower level than that of the interlayer insulating layer.

In example embodiments, the separation structure may further include a second insulating pattern on the first insulating pattern. An upper width of the second insulating pattern may be greater than a width of the first insulating pattern.

According to example embodiments of the inventive concept, a semiconductor device may include a substrate including an active pattern, a device isolation layer that defines the active pattern, and a separation structure that crosses the active pattern and the device isolation layer and that divides the active pattern into first and second regions.

The separation structure may include a first insulating pattern in a recess region between the first and second regions and a second insulating pattern on the first insulating pattern. A bottom surface of the recess region may be positioned at a lower level than a top surface of the device isolation.

Some embodiments of the present inventive concept are directed to semiconductor devices that include a separation structure. In some embodiments, the separation structure may include a first insulating pattern that fills a recess region of a substrate that is between first and second regions of an active pattern, the first insulating pattern including a concave top surface, a second insulating pattern that is on the first insulating pattern, and spacers on opposite sidewalls of the first insulating pattern.

Some embodiments provide that a center of the top surface of the first insulating pattern is positioned at a lower level than both edges thereof, the second insulating pattern is on the top surface of the first insulating pattern, and an upper width of the second insulating pattern is greater than a width of the first insulating pattern.

In some embodiments, a top surface of the second insulating pattern is coplanar with a top surface of an interlayer insulating layer on the active pattern on the substrate.

Some embodiments include a device isolation layer that defines the active pattern on the substrate. In some embodiments, the first insulating pattern extends on the device isolation layer along a first direction that is parallel to a top surface of the substrate, an upper portion of the active pattern is protruded on the device isolation layer, and a bottom surface of the recess region is positioned at a lower level relative to the substrate than a top surface of the device isolation layer.

Some embodiments provide that the top surface of the first insulating pattern is positioned at a lower level than top surfaces of the first and second gate electrodes and is positioned at a higher level than a top surface of the active pattern.

In some embodiments, a center of the top surface of the first insulating pattern is positioned at a lower level than top surfaces of the spacers.

In some embodiments, a bottom surface of the first insulating pattern is at a lower level relative to the substrate than bottom surfaces of the spacers, and the spacers are on the opposite sidewalls of the first insulating pattern.

Some embodiments provide that the separation structure further comprises a conductive pattern on the first insulating pattern.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A to 14A, FIGS. 6B to 14B, FIGS. 6C to 14C and FIGS. 10D to 14D are cross-sectional views illustrating a method of manufacturing a semiconductor device according to example embodiments of the inventive concept.

Figure 1:
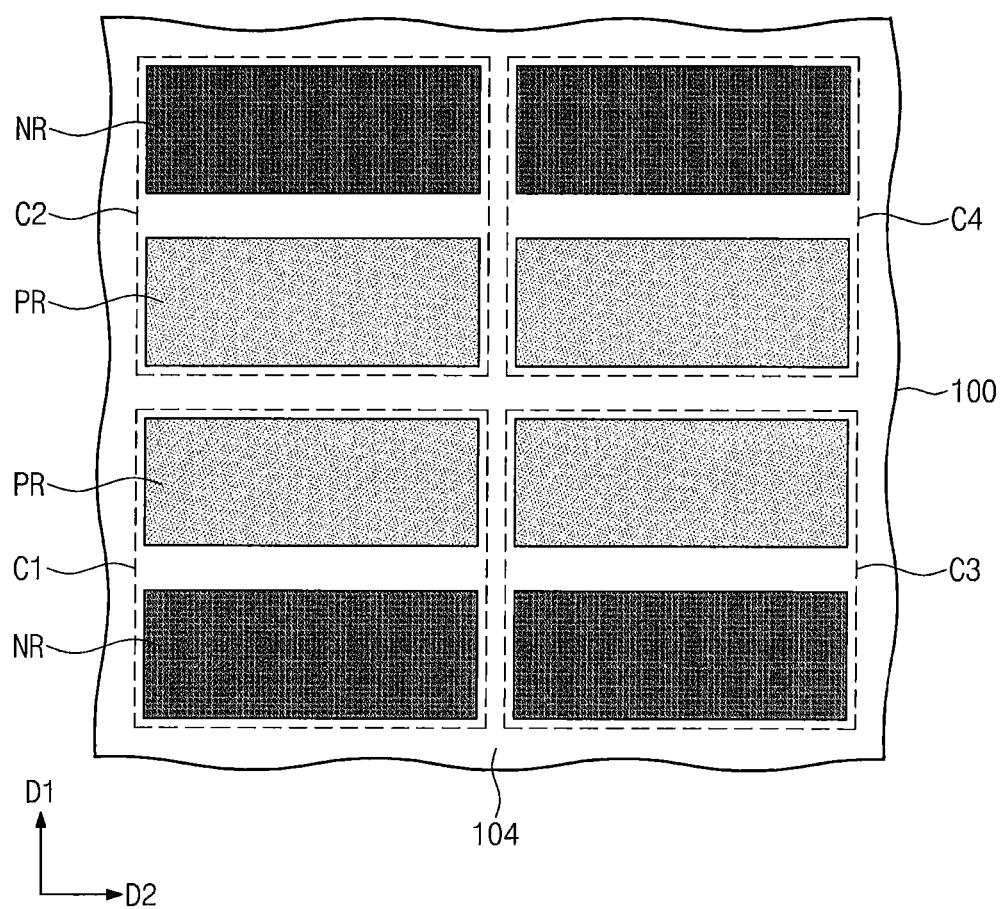
FIG. 1 is a plan view of a semiconductor device according to example embodiments of the inventive concept.

It should be noted that these figures are intended to illustrate the general characteristics of methods, structure and/or materials utilized in certain example embodiments and to supplement the written description provided below. These drawings should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view of a semiconductor device according to example embodiments of the inventive concept.

Referring to FIG. 1, the semiconductor device according to example embodiments of the inventive concept may include a plurality of logic cells C1, C2, C3 and C4 provided on a substrate 100. Each of the logic cells C1, C2, C3 and C4 may include a plurality of transistors. As an example, the semiconductor device may include a first logic cell C1, a second logic cell C2 spaced apart from the first logic cell C1 in a first direction D1, a third logic cell C3 spaced apart from the first logic cell C1 in a second direction D2 perpendicular to the first direction D1, and a fourth logic cell C4 spaced apart from the second logic cell C2 in the second direction D2. Each of the logic cells C1, C2, C3 and C4 may include active regions separated from each other by a device isolation layer 104. Each of the logic cells C1, C2, C3 and C4 may include a PMOSFET region PR and an NMOSFET region NR separated from each other by the device isolation layer 104.

As an example, the PMOSFET region PR and the NMOSFET region NR may be spaced apart from each other in the first direction D1. The PMOSFET region PR of the first logic cell C1 may be adjacent the PMOSFET region PR of the second logic cell C2 in the first direction D1. In the description below, a logic cell may be referred to as a unit configured to perform a logical operation, and the first logic cell C1 will be described as an example of such a logic cell.

The number of logic cells may be variously changed from that illustrated in the drawings.

Figure 2:
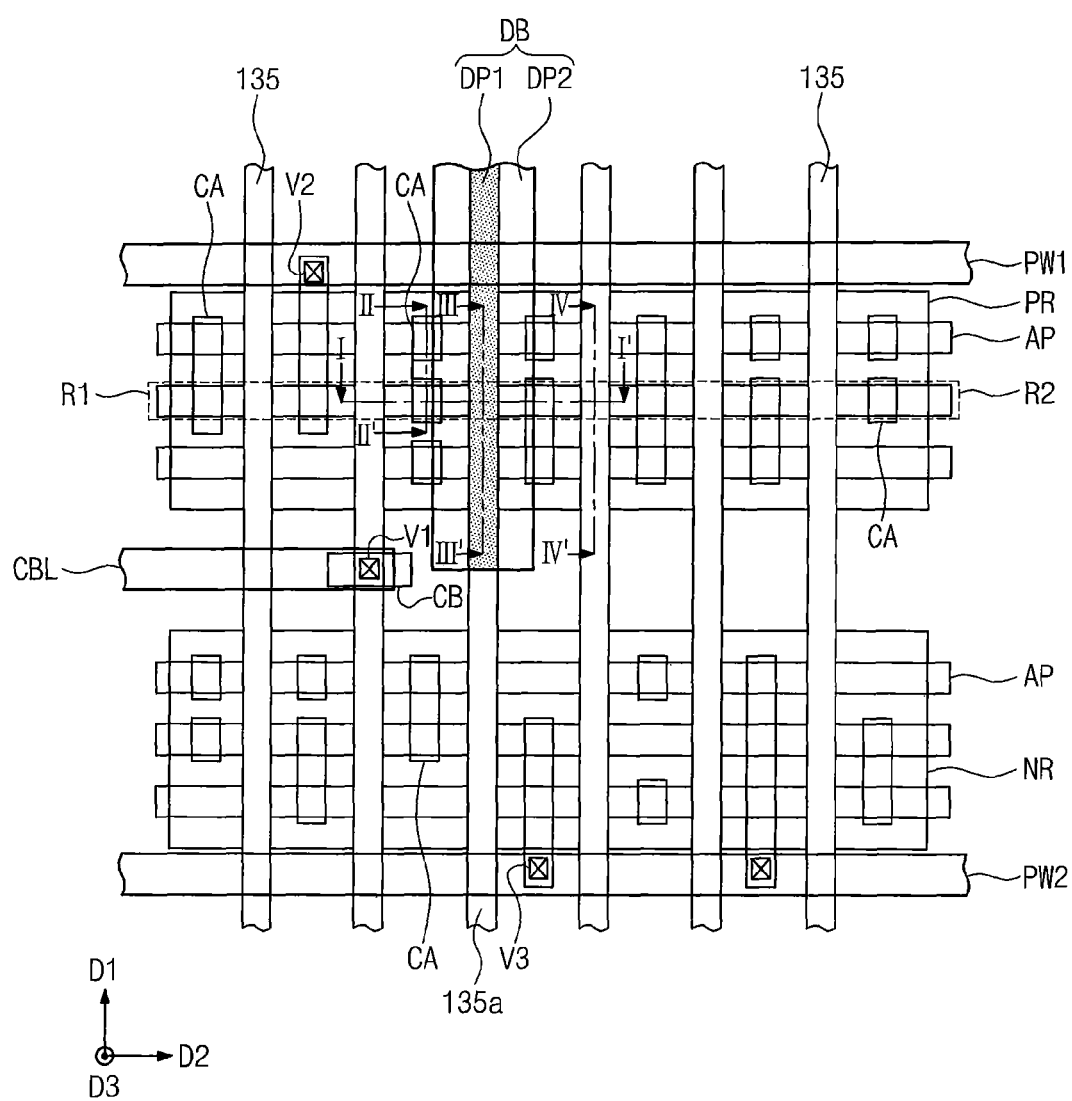
FIG. 2 is a plan view of a first logic cell of FIG. 1, which is illustrated to provide a description of a semiconductor device according to example embodiments of the inventive concept.
Figure 3A:
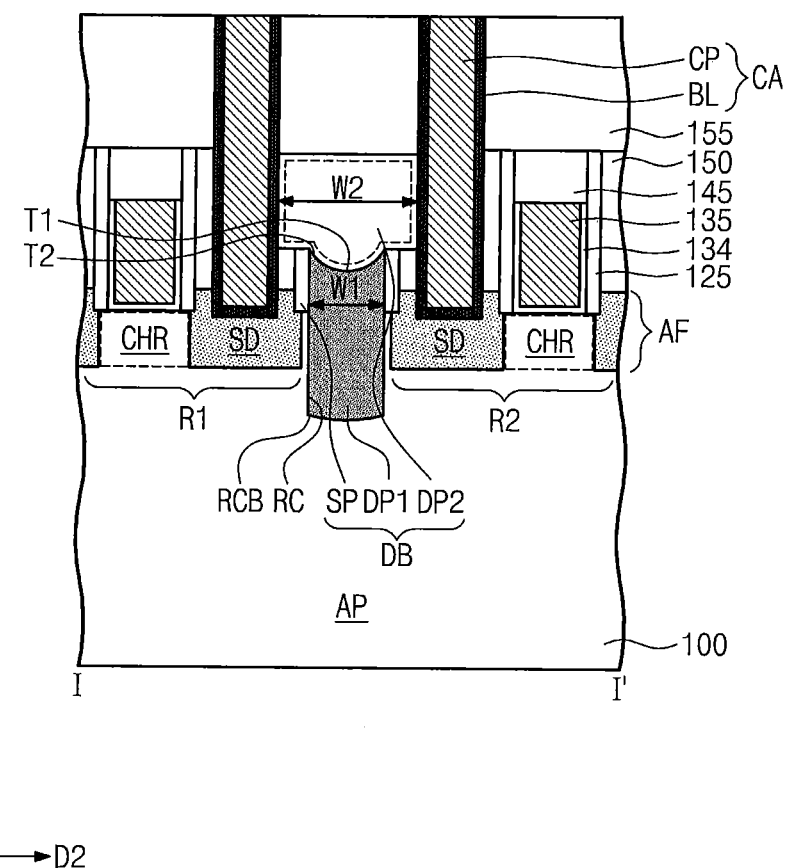
FIGS. 3A, 3B, 3C and 3D are cross-sectional views taken along lines I-I', II-II', III-III' and IV-IV' of FIG. 2, respectively.
Figure 3B:
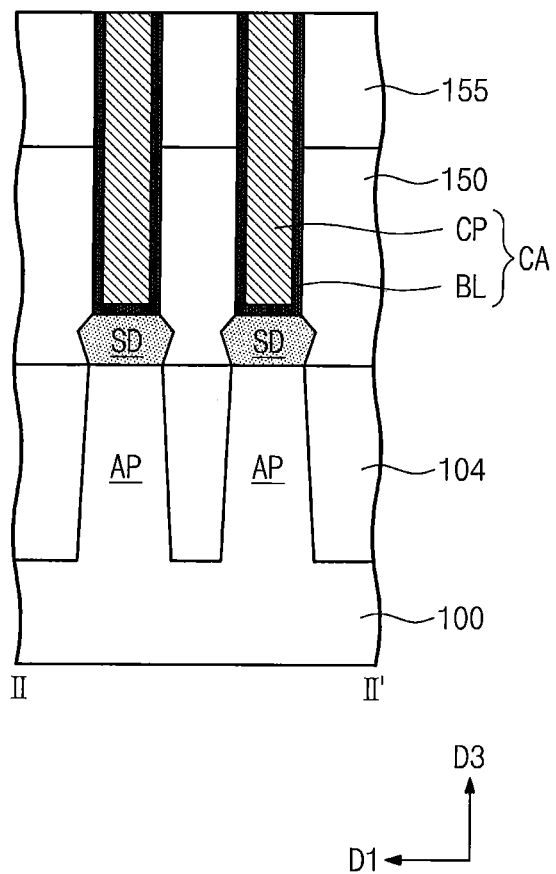
Figure 3C:
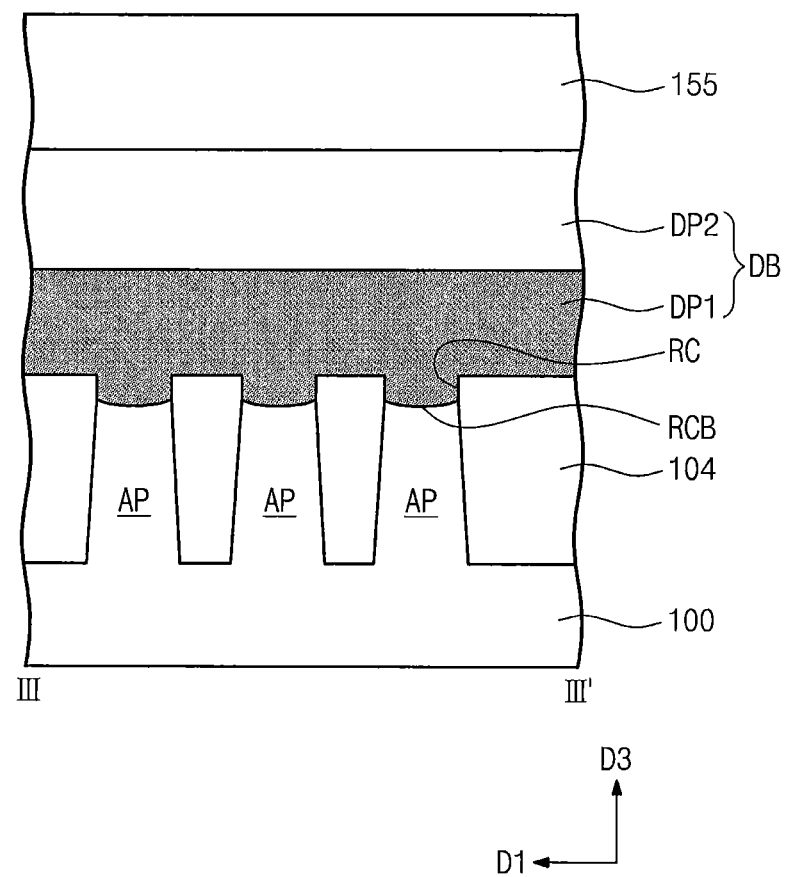
Figure 3D:
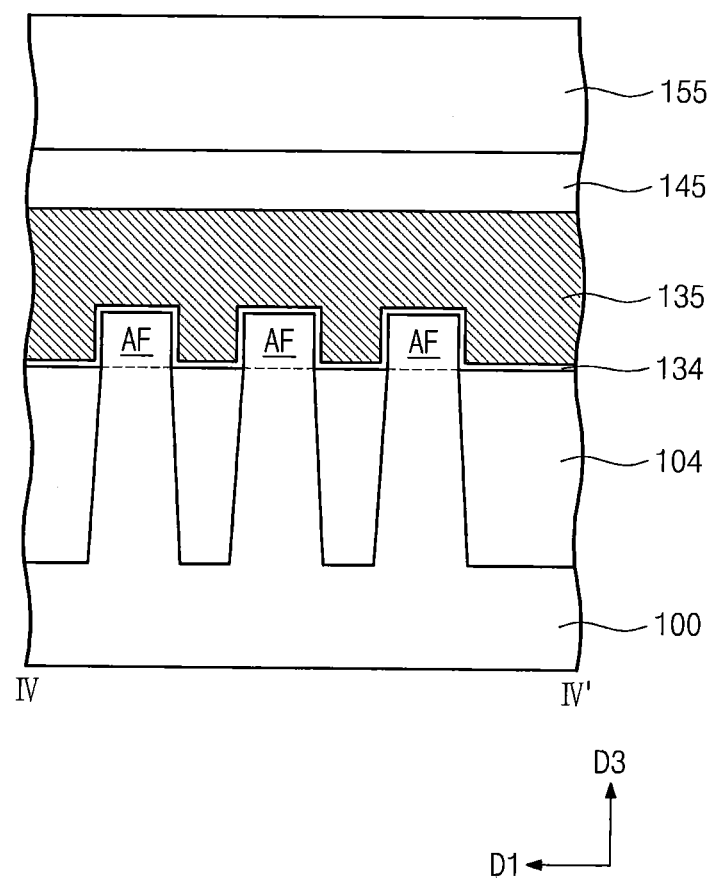

FIG. 2 is a plan view illustrating a semiconductor device according to example embodiments of the inventive concept. For example, FIG. 2 is a plan view of the first logic cell C1 of the FIG. 1. Hereinafter, example embodiments of the inventive concept will be described with reference to the first logic cell C1 of the FIG. 1, but other logic cells may be substantially the same as or similar to the first logic cell C1. FIGS. 3A, 3B, 3C and 3D are cross-sectional views taken along lines I-I', II-II', III-III' and IV-IV' of FIG. 2, respectively.

Referring to FIGS. 2 and 3A to 3D, the device isolation layer 104 may be disposed in the substrate 100 to define the PMOSFET and NMOSFET regions PR and NR. The device isolation layer 104 may be formed in an upper portion of the substrate 100. As an example, the device isolation layer 104 may include an insulating material such as a silicon oxide layer.

The PMOSFET and NMOSFET regions PR and NR may be spaced apart from each other in the first direction D1 parallel to a top surface of the substrate 100 with the device isolation layer 104 interposed therebetween. Although each of the PMOSFET and NMOSFET regions PR and NR may be shown as a single region, it may be formed to include a plurality of regions which are separated from each other by the device isolation layer 104.

A plurality of active patterns AP may be provided on the PMOSFET and NMOSFET regions PR and NR to extend in the second direction D2 perpendicular to the first direction D1. The active patterns AP may be arranged along the first direction D1. The active patterns AP may be a first conductivity type. The device isolation layer 104 may define the active patterns AP. Although the number of the active patterns AP provided respectively on the PMOSFET and NMOSFET regions PR and NR may be shown to be three, example embodiments of the inventive concept may not limited thereto.

The active patterns AP may include active fins AF protruded between the device isolation layers 104, respectively. More specifically, each of the active fins AF may be protruded in the third direction D3 perpendicular to a top surface of the substrate 100 from the active pattern AP. Each of the active fins AF may include source/drain regions SD and a channel region CHR interposed between the source/drain regions SD.

According to example embodiments of the inventive concept, gate electrodes 135 may be disposed on the substrate 100 to cross the active patterns AP. The gate electrodes 135 may be perpendicularly overlapped with the channel regions CHR of the active fins AF, respectively. The gate electrodes 135 may be a line shape. The gate electrodes 135 may extend in the first direction D1 and cross the active fins AF protruded between the device isolation layers 104.

Gate spacers 125 may be disposed on opposite sidewalls of each of the gate electrodes 135. The gate spacers 125 may extend in the first direction D1 along the line-shaped gate electrodes 135. Top surfaces of the gate spacers 125 may be positioned at a higher level than those of the gate electrodes 135. The top surfaces of the gate spacers 125 may be coplanar with a top surface of a first interlayer insulating layer 150. The gate spacers 125 may include at least one of silicon oxide (SiO$_2$), silicon carbide nitride (SiCN), silicon carbide oxynitride (SiCON) and silicon nitride (SiN). The gate spacers 125 may include a multi-layer including at least one of silicon oxide (SiO$_2$), silicon carbide nitride (SiCN), silicon carbide oxynitride (SiCON) and/or silicon nitride (SiN).

A gate insulating layers 134 may be disposed between the gate electrode 135 and the substrate 100 and between the gate electrode 135 and the gate spacers 125. The gate insulating layer 134 may extend along a bottom surface of the gate electrode 135. Thus, the gate insulating layer 134 may cover a top surface and sidewalls of the channel region CHR. The gate insulating layer 134 may horizontally extend from the active fins AF and partially cover top surfaces of the device isolation layers 104. Thus, some portions of top surfaces of the device isolation layers 104 may not be covered by the gate insulating layer 134 but may be covered by the first interlayer insulating layer 150.

The gate insulating layer 134 may include high-k dielectric material. For example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide and/or lead zinc niobate.

Gate capping layers 145 may be disposed on the gate electrodes 135, respectively. The gate capping layers 145 may extend in the first direction D1 along the gate electrodes 135.

The gate capping layers 145 may include a material having an etch selectivity with respect to first and second interlayer insulating layers 150 and 155. For example, the gate capping layers 145 may include at least one of silicon oxynitride (SiON), silicon carbide nitride (SiCN), silicon carbide oxynitride (SiCON) and/or silicon nitride (SiN).

The source/drain regions SD may be provided in the active fins AF at both sides of each of the gate electrodes 135. The source/drain regions SD may include epitaxial patterns formed by epitaxial growth from the active patterns AP. When viewed in a cross-sectional view along the second direction D2, a top surface of the channel region CHR may be positioned at a higher level than a bottom surface of the source/drain regions SD. A top surface of the source/drain regions SD may be positioned at the same or higher level than the top surface of the channel region CHR.

The source/drain regions SD may include a semiconductor element different from the substrate 100. For example, the source/drain regions SD may include the semiconductor element whose lattice constant is greater or smaller than that of the substrate 100. In this case, compressive stress or tensile stress may be created in the channel region CHR because the source/drain regions SD include the semiconductor element different from the substrate 100. As an example, when the substrate 100 is a silicon substrate, the source/drain regions may include silicon-germanium (SiGe) or germanium (Ge). In this case, the compressive stress may be created in the channel region CHR, and a field effect transistor with the source/drain regions SD may preferably be a PMOSFET. For other example, when the substrate 100 is a silicon substrate, the source/drain regions may include silicon carbide (SiC). In this case, the tensile stress may be created in the channel region CHR, and a field effect transistor with the source/drain regions SD may preferably be an NMOSFET. A mobility of carriers in the channel regions CHR may be improved by introducing the compressive or tensile stress in the channel regions when the field effect transistor is operated. The source/drain regions SD may be the second conductivity type different from the active pattern AP.

According to example embodiments of the inventive concept, a separation structure DB may be disposed to cross the active pattern AP in the PMOSFET region PR. The separation structure DB between a pair of the gate electrodes 135 may extend in the first direction parallel to the gate electrodes 135. That is, the separation structure may have a line shape extending in the first direction. Unlike the gate electrodes 135, the separation structure DB may penetrate the active fins AF protruded between the device isolation layers 104.

As an example, the separation structure DB may be aligned with any one of the gate electrode (e.g., gate electrode 135a), which crosses a NMOSFET region NR and extends in the first direction D1. The first direction D1 may be an extending direction of the gate electrode 135a and the separation structure DB. Thus, one end of the separation structure DB may be connected to one end of the gate electrode 135a. As other example, the separation structure DB and the gate electrode 135a may be spaced apart from each other in the first direction D1, but it is not limited thereto.

The separation structure DB may include a first insulating pattern DP1 and a second insulating pattern DP2. The first insulating pattern DP1 may penetrate the active fin AF and extend in the first direction D1. The second insulating pattern DP2 may extend together with the first insulating pattern DP1 in the first direction D1 to cover the first insulating pattern DP1. The separation structure DB may further include separation spacers SP covering sidewalls of an upper portion of the first insulating pattern DP1. The separation spacers SP may extend together with the first insulating pattern DP1 in the first direction D1.

The first insulating pattern DP1 may cross the active patterns AP and may divide each of the active patterns AP into two regions. For example, referring back to FIGS. 2 and 3A, the active pattern AP or the active fin AF may be divided into a first region R1 and a second region R2 by based on the first insulating pattern DP1. Movement or diffusion of the carriers between the first region R1 and the second region R2 may be blocked by the first insulating pattern DP1.

A recess region RC may be defined between the first region R1 and the second region R2. The recess region RC may be formed at an upper portion of the active pattern AP and may extend toward a bottom surface of the substrate 100. Furthermore, a bottom surface RCB of the recess region RC may be positioned at a lower level than a top surface of the device isolation layer 104. Accordingly, some of sidewall of the recess region RC may be defined by the device isolation layers 104 (refer to FIG. 3C). The recess region RC may be provided in a plurality and may be formed in the active patterns AP to be penetrated by the first insulating pattern DP1. The first insulating pattern DP1 may completely fill the recess region RC and may extend on the device isolation layers 104. When viewed a cross-sectional view along the first direction D1, the first insulating pattern DP1 may have a comb shape (refer to FIG. 3C)

A source/drain region SD disposed on the respective first and second regions R1 and R2 may be adjacent the first insulating pattern DP1. The first insulating pattern DP1 may be interposed between a pair of source/drains SD adjacent the first insulating pattern DP1. The separation spacers SP may be disposed between the pair of source/drains SD and the first insulating pattern DP1. A bottom surface of the first insulating pattern DP1 (that is, the bottom surface RCB of the recess region RC) may be positioned at a lower level than a bottom surface of the separation spacers SP.

A top surface of the first insulating pattern DP1 may be positioned at a lower level than a top surface of the gate electrode 135 and may be positioned at a higher level than a top surface of the active patterns AP. More specifically, the top surface of the first insulating pattern DP1 may be positioned at a level which is located between the top surface of the gate electrode 135 and a top surface of the source/drain region SD. Furthermore, the top surface of the first insulating pattern DP1 may be positioned at a lower level than a top surface of the first interlayer insulating layer 150.

When viewed a cross-sectional view along the second direction D2, the first insulating pattern DP1 may have a concave-shaped surface (refer to FIG. 3). As an example, a center T1 of the top surface of the first insulating pattern DP1 may be positioned at a lower level than an edge T2 of the top surface of the first insulating pattern DP1. The top surface of the first insulating pattern DP1 may have a curved concave-shaped surface. As another example, the top surface of the first insulating pattern DP1 may have a V-shaped surface. The both edges T2 of the top surface of the first insulating pattern DP1 may be positioned at substantially the same level as the top surfaces of the separation spacers SP. The center T1 of the top surface of the first insulating pattern DP1 may be positioned at a lower level than the top surfaces of the separation spacers SP.

The first insulating pattern DP1 may include a silicon nitride layer. For example, the first insulating pattern DP1 may include silicon carbide nitride (SiCN), silicon carbide oxynitride (SiCON) or silicon nitride (SiN). As previously described, the channel region CHR may be provided with the compressive or tensile stresses. The stress balance may be broken by the recess region RC that divides the active pattern into first and second regions R1 and R2. In this case, the stress balance may be maintained by completely filling the recess region RC with the first insulating pattern DP1 including the silicon nitride layer.

The second insulating pattern DP2 may cover the top surface of the first insulating pattern DP1 and the top surfaces of the separation pattern SP. A width W2 of an upper portion of the second insulating pattern DP2 may be greater than a width W1 of the first insulating pattern DP1. Thus, contacts CA adjacent the first insulating pattern DP1 may penetrate both edge portions of the second insulating pattern DP2. More specific description will be described later. A top surface of the second insulating pattern DP2 may be coplanar with the top surface of the first interlayer insulating layer 150.

The second insulating pattern DP2 may include at least one of silicon oxide ($SiO_2$), silicon carbide nitride (SiCN), silicon carbide oxynitride (SiCON) and/or silicon nitride (SiN). For example, second insulating pattern DP2 may include the same silicon oxide layer as the first interlayer insulating layer 150. However, the second insulating pattern DP2 may include a material different from the first insulating pattern DP1.

A first interlayer insulating layer 150 may be disposed on the substrate 100. The first interlayer insulating layer 150 may cover the gate spacers 125, the source/drain region SD and the separation structure DB. The top surface of the first interlayer insulating layer 150 may be substantially coplanar with the top surface of the second insulating pattern DP2. A second interlayer insulating layer 155 covering the gate capping layers 145 and the second insulating pattern DP2 may be disposed on the first interlayer insulating layer 150.

Contacts CA may be disposed at the both sides of the gate electrodes 135 through the first and second interlayer insulating layers 150 and 155, and may be electrically connected to the source/drain regions SD. The one contact CA may be connected to the one source/drain region SD, or may be connected to a plurality of the source/drain regions SD, but it is not limited thereto. Each of the contacts CA may include a conductive pillar CP and a barrier layer BL surrounding the conductive pillar CP. The barrier layer BL may cover sidewalls and a bottom surface of the conductive pillar CP. The conductive pillar CP may include metal such as tungsten. The barrier layer BL may include metal nitride such as titanium/titanium nitride (TiN).

A pair of contacts CA may be electrically connected to a pair of source/drain regions SD adjacent the first insulating pattern DP1. That is, the pair of contacts CA may be disposed on the first and second regions R1 and R2, respectively. Referring back to FIGS. 2 and 3A, the pair of contacts CA may penetrate the both edge portions of the second insulating pattern DP2. Accordingly, the width W2 of the upper portion of the second insulating pattern DP2 may be substantially the same as a distance between the pair of contacts. The second insulating pattern DP2 may be directly in contact with the pair of contacts CA. The first insulating pattern DP1 may be spaced apart from the pair of contacts CA, because the first insulating pattern DP1 has the width W1 smaller than the width W2 of the upper portion of the second insulating pattern DP2. Accordingly, the first insulating pattern DP1 may not affect a formation of the contacts CA during forming the contacts CA, because the first insulating pattern DP1 is spaced apart from contacts CA. More specific description will be described later.

In example embodiments, although not shown in the drawings, a silicide layer (not shown) may be interposed between the source/drain region SD and the contact CA. That is, the contact CA may be electrically connected to the source/drain region SD through the silicide layer. The silicide layer may include metal-silicide, such as titanium silicide, tantalum silicide and/or tungsten silicide.

In example embodiments, although not shown in the drawings, a contact spacer (not shown) may be interposed between the contact CA and the first interlayer insulating layer 150 and between the contact CA and the second insulating pattern DP2. The contact spacer may surround a sidewall of the contact CA. Accordingly, in this case, the pair of contacts CA may not be directly in contact with the second insulating pattern DP2. The contact spacers SP may include at least one of silicon oxide (SiO$_2$), silicon carbide nitride (SiCN), silicon carbide oxynitride (SiCON) and/or silicon nitride (SiN).

A gate contact CB and a conductive line CBL may be provided on any one of the gate electrodes 135. A first via V1 may be disposed between the gate contact CB and the conductive line CBL. The conductive line CBL may be electrically connected to one or more of the gate electrodes 135 through the first via V1 and the gate contact CB, and apply a signal to the respective gate electrodes 135.

The first logic cell C1 may include a first wiring line PW1 provided outside the PMOSFET region PR and a second wiring line PW2 provided outside the NMOSFET region NR. In example embodiments, the first wiring line PW1 on the PMOSFET region PR may serve as a pathway for delivering a drain voltage (Vdd) or a power voltage. The second wiring line PW2 on the NMOSFET region NR may serve as a pathway for delivering a source voltage (Vss) or a ground voltage.

Referring back to FIGS. 1 and 2, the first and second wiring lines PW1 and PW2 may extend parallel to the second direction D2, and may be shared by the logic cells that are adjacent one another in the second direction D2. As an example, the first wiring line PW1 may be shared by the first and the third logic cell C1 and C3. Furthermore, the first wiring line PW1 may be shared by the PMOSFET regions PR, which are respectively provided in the first and second logic cell C1 and C2.

In example embodiments, a second via V2 may be provided on any one of the contacts CA. Accordingly, the source/drain region SD may be electrically connected to the first wiring line PW1 through any one of the contacts CA and the second via V2. Similarly, the source/drain SD on the NMOSFET region NR may be electrically connected to the second wiring line PW2 through any one of the contacts CA and a third via V3.

Figure 4:
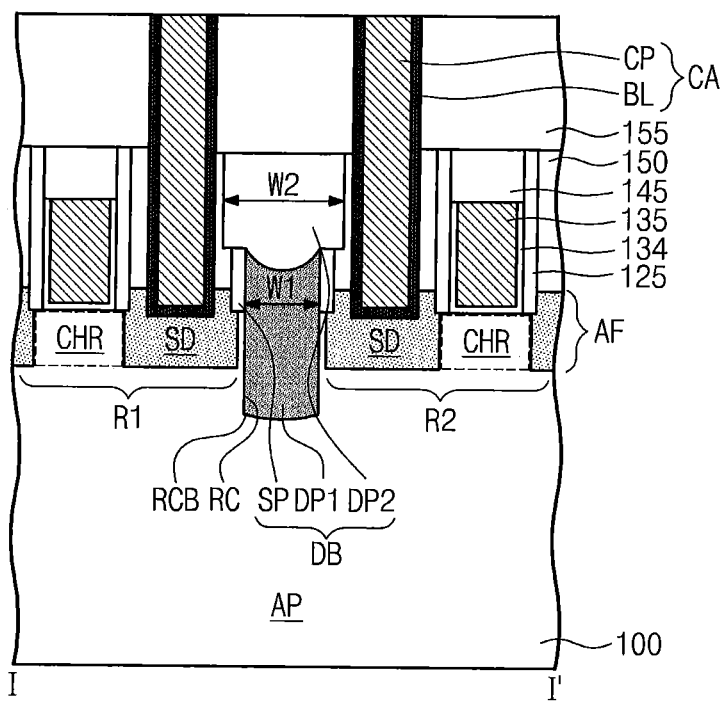
FIG. 4 is a cross-sectional view taken along line I-I' of FIG. 2, which is illustrated to provide a description of a semiconductor device according to other example embodiments of the inventive concept.

FIG. 4 is a cross-sectional view taken along line I-I' of FIG. 2, which is illustrated to provide a description of a semiconductor device according to other example embodiments of the inventive concept. In the following description, an element previously described with reference to FIGS. 2 and 3A to 3D may be identified by a similar or identical reference number without repeating an overlapping description thereof.

Referring to FIGS. 2, 3B to 3D and 4, a width W2 of an upper portion of a second insulating pattern DP2 may be smaller than a distance between a pair of contacts CA adjacent to it. That is, the pair of contacts CA may be spaced apart from the separation structure DB. Accordingly, the pair of contacts CA may not penetrate both edge portions of the second insulating pattern DP2, and may penetrate first and second interlayer insulating layers 150 and 155.

Figure 5A:
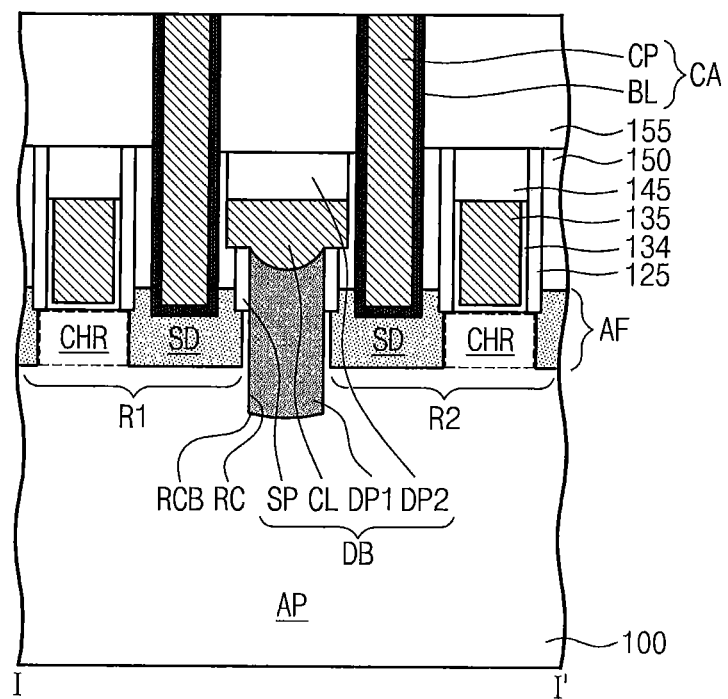
FIGS. 5A to 5B are cross-sectional views illustrating a semiconductor device according to still other example embodiments of the inventive concept.
Figure 5A:
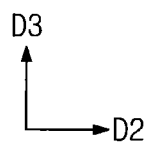
Figure 5B:
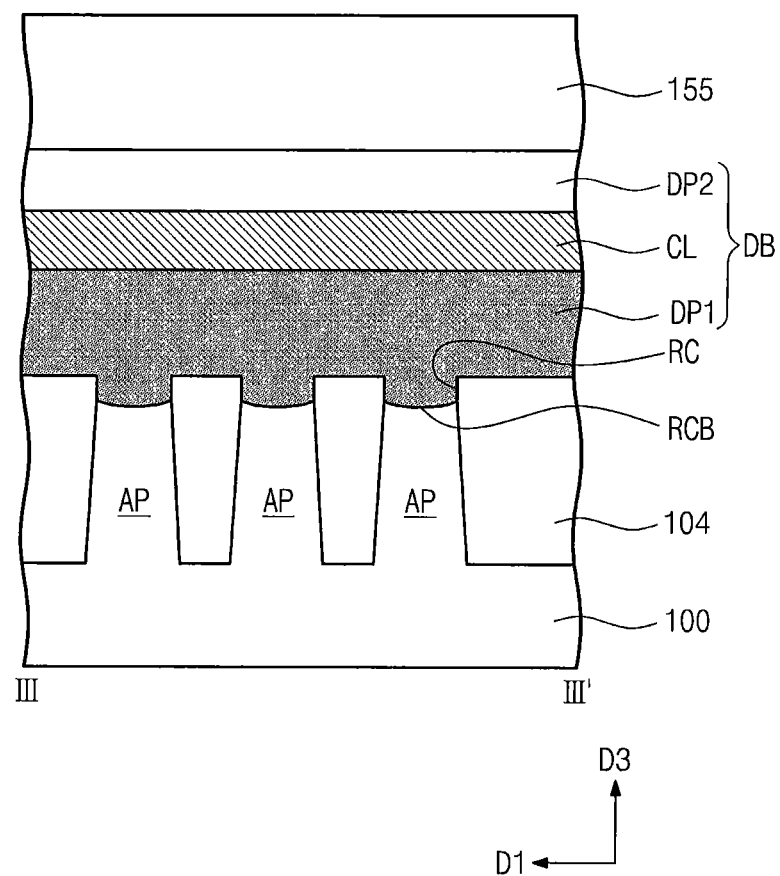
Figure 6A:
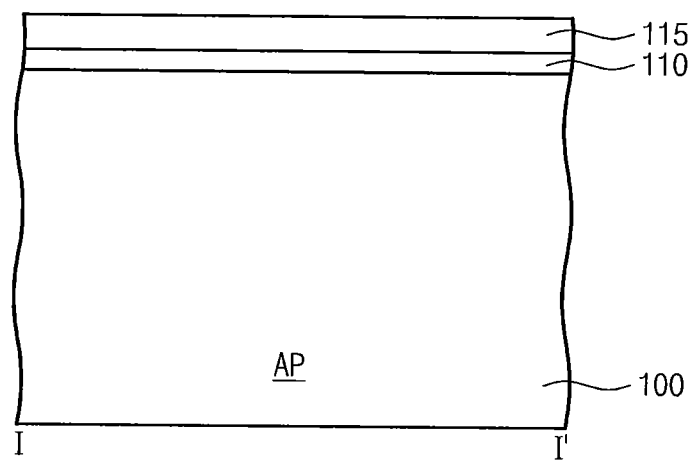
Figure 6A:
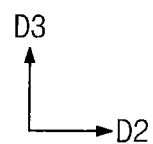
Figure 6B:
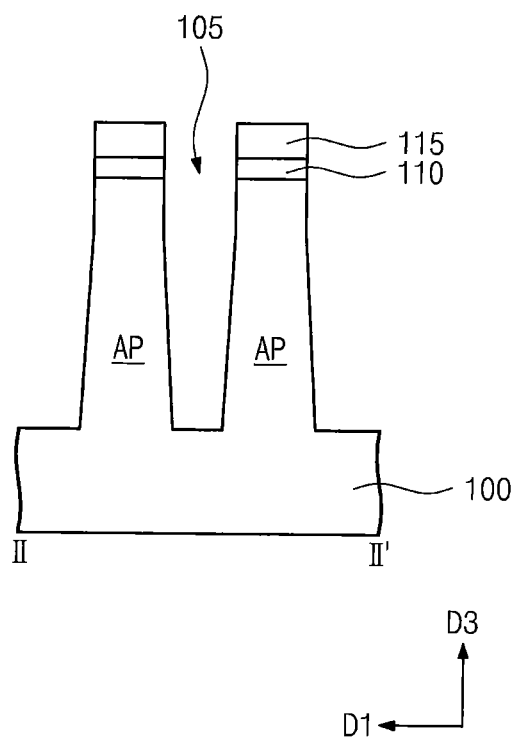
Figure 6C:
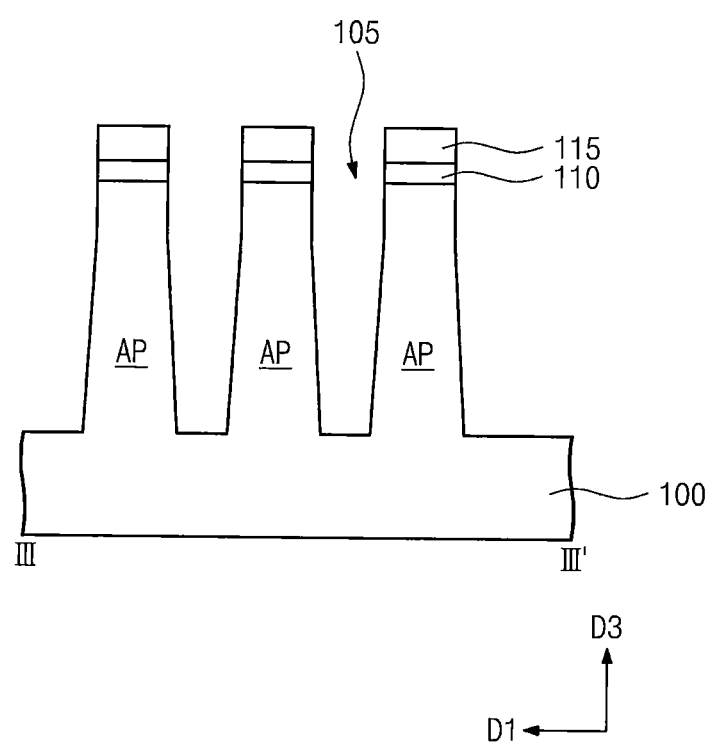
Figure 7A:
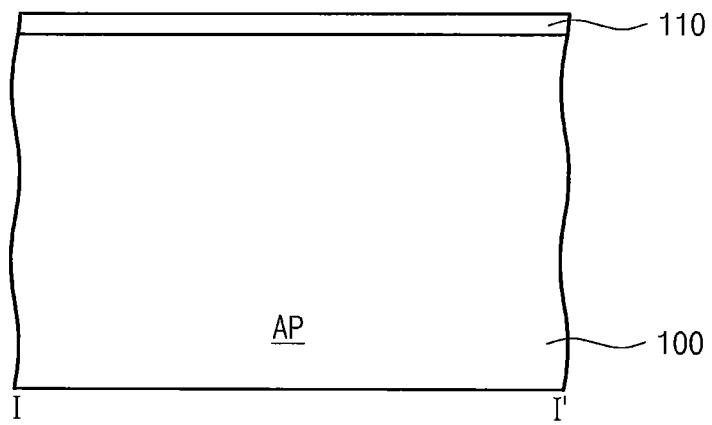
Figure 7A:
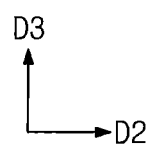
Figure 7B:
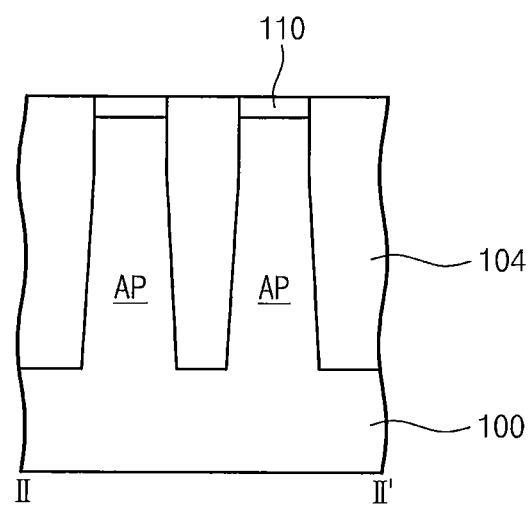
Figure 7B:
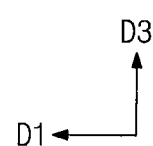
Figure 7C:
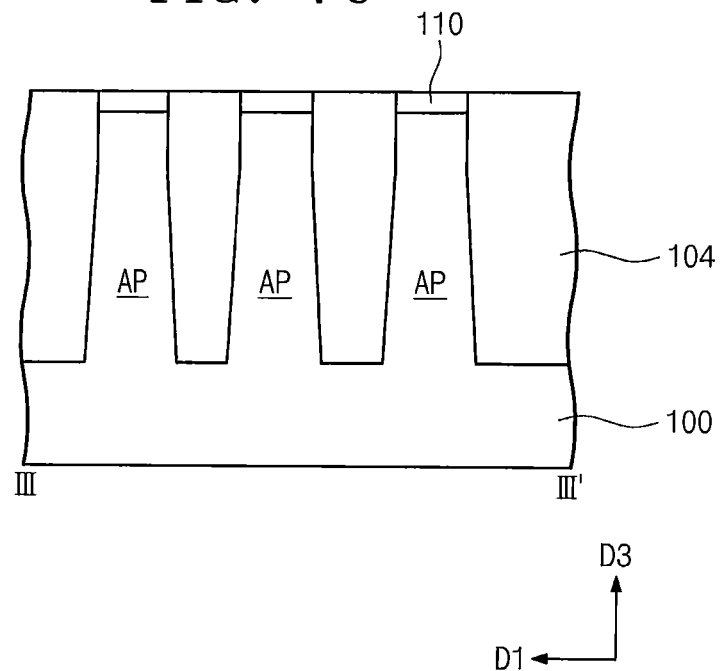
Figure 8A:
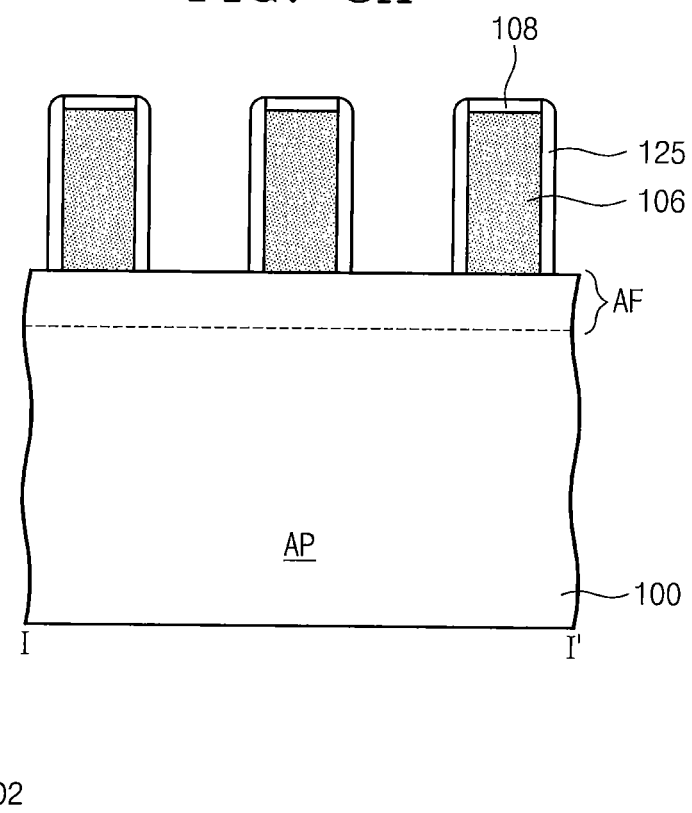
Figure 8B:
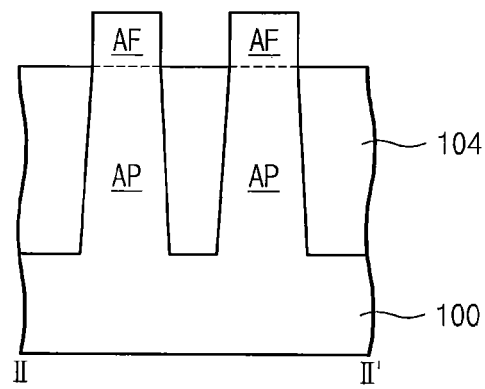
Figure 8C:
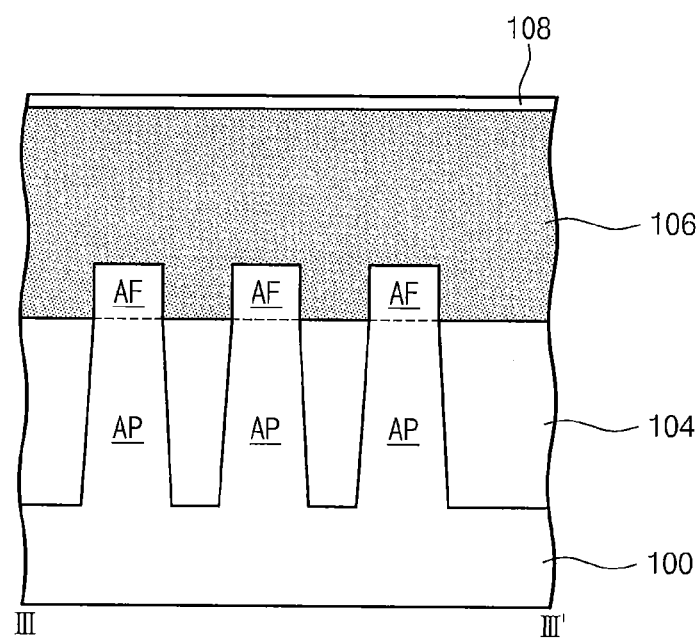
Figure 9A:
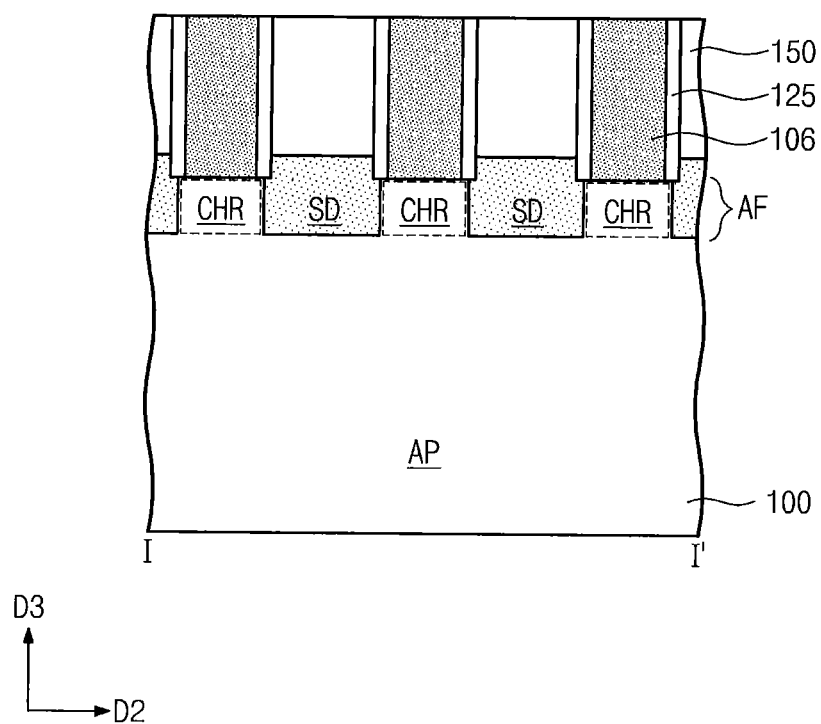
Figure 9B:
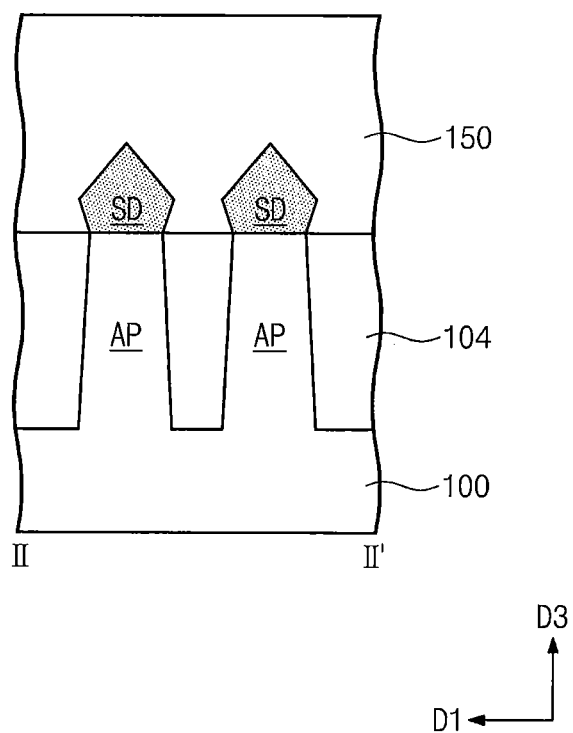
Figure 9C:
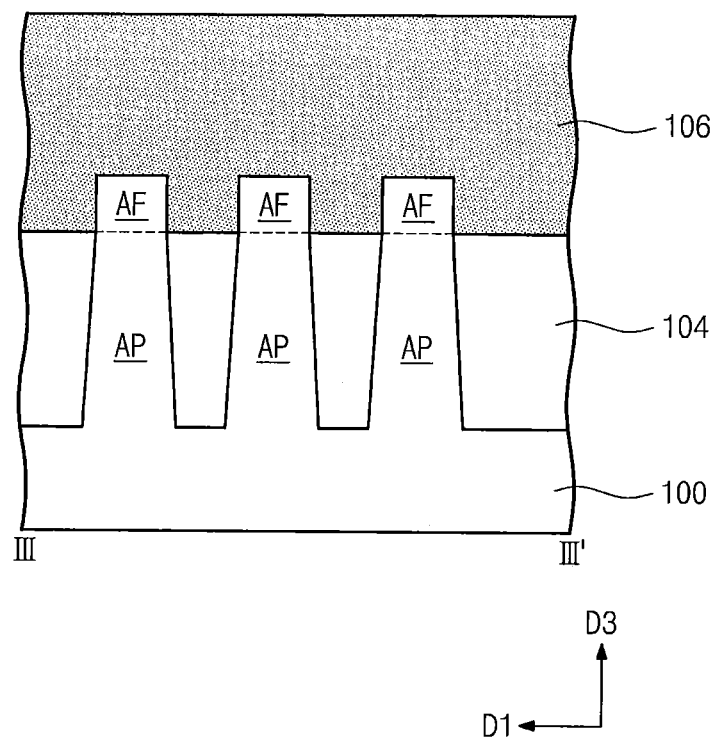
Figure 10A:
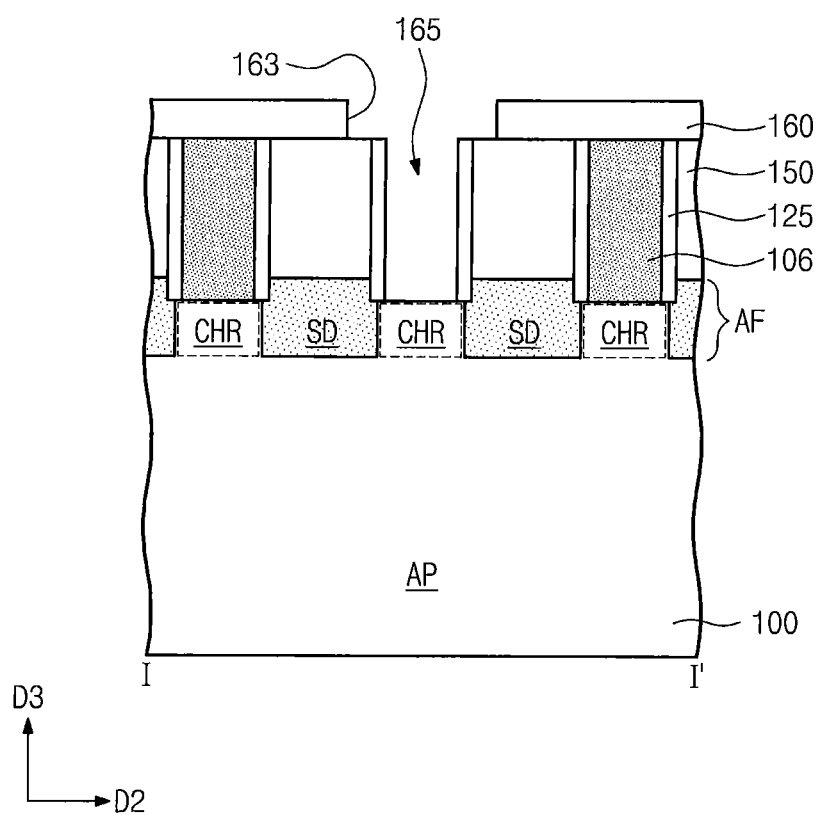
Figure 10B:
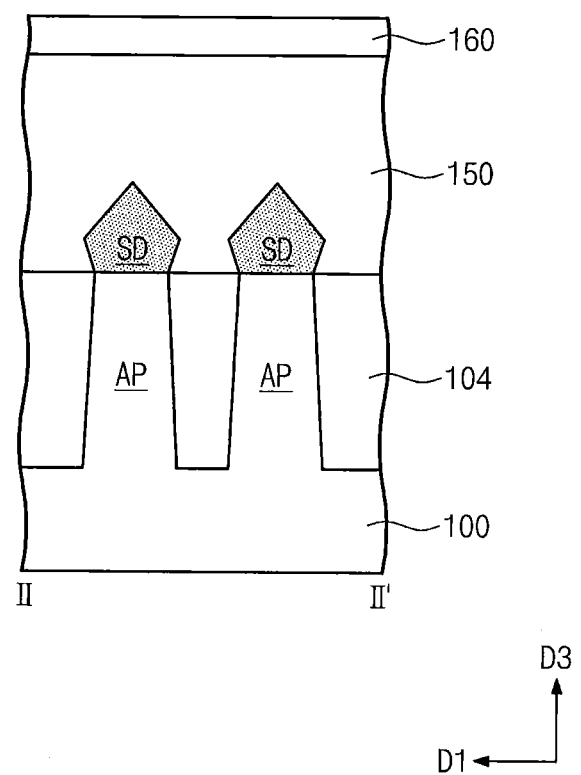
Figure 10C:
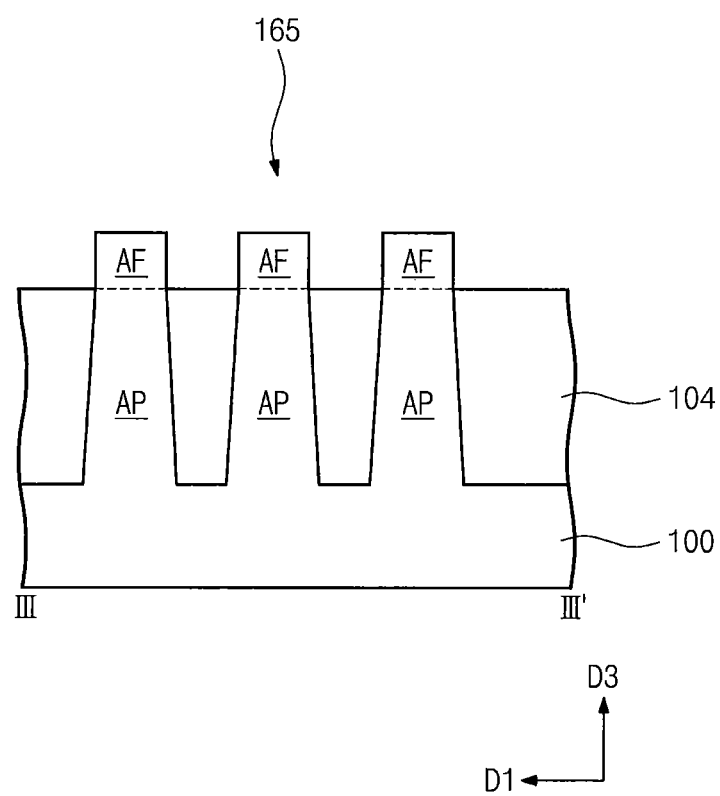
Figure 10D:
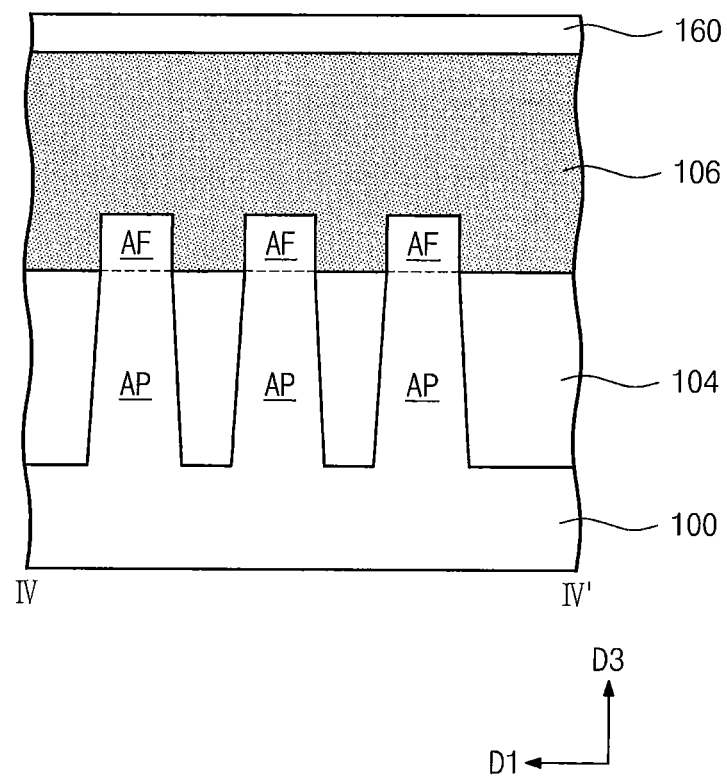
Figure 11A:
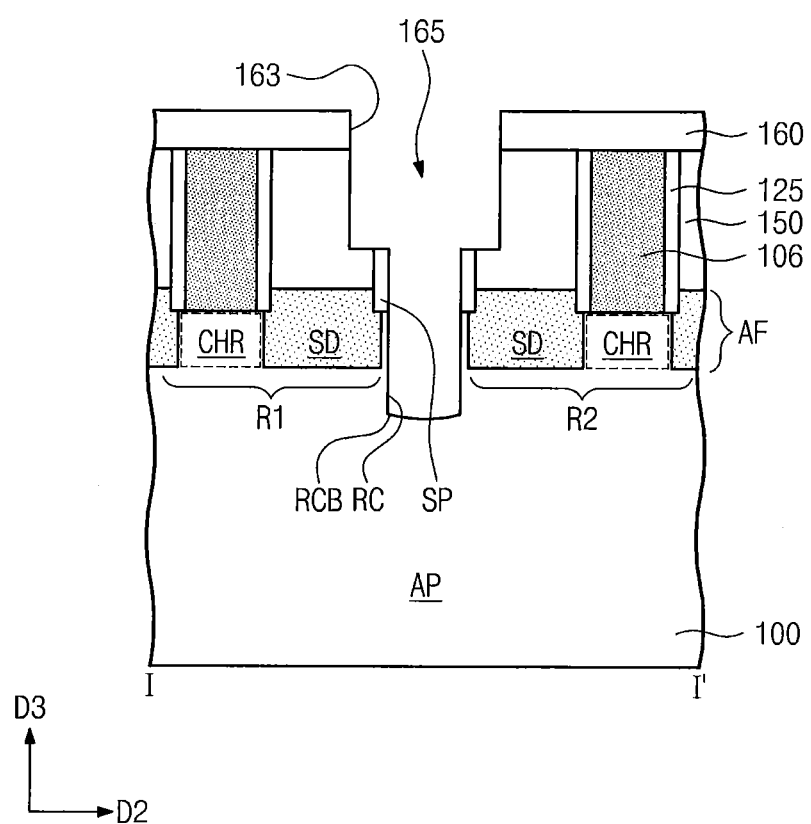
Figure 11B:
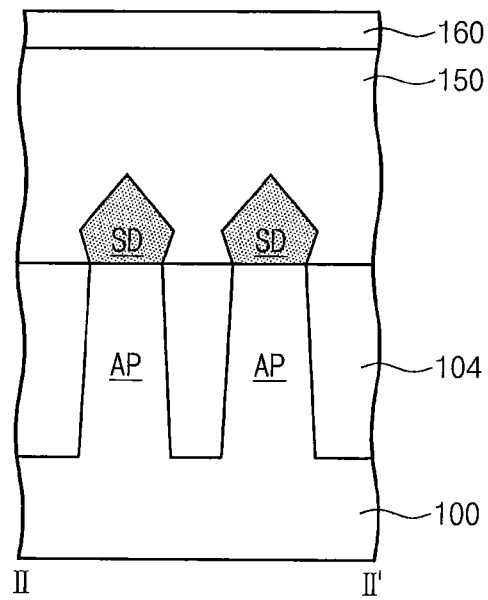
Figure 11C:
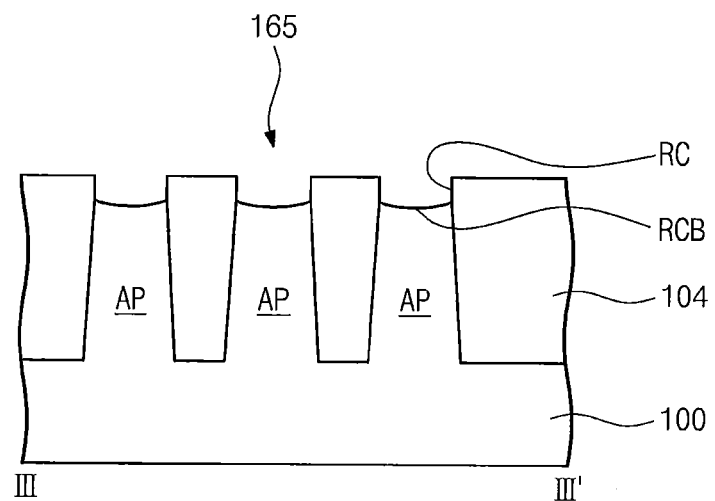
Figure 11D:
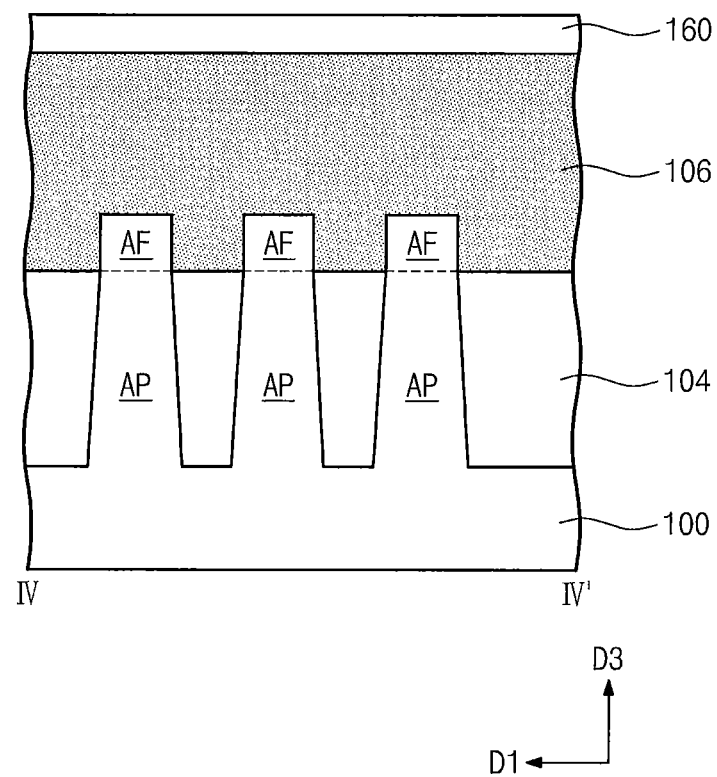
Figure 12A:
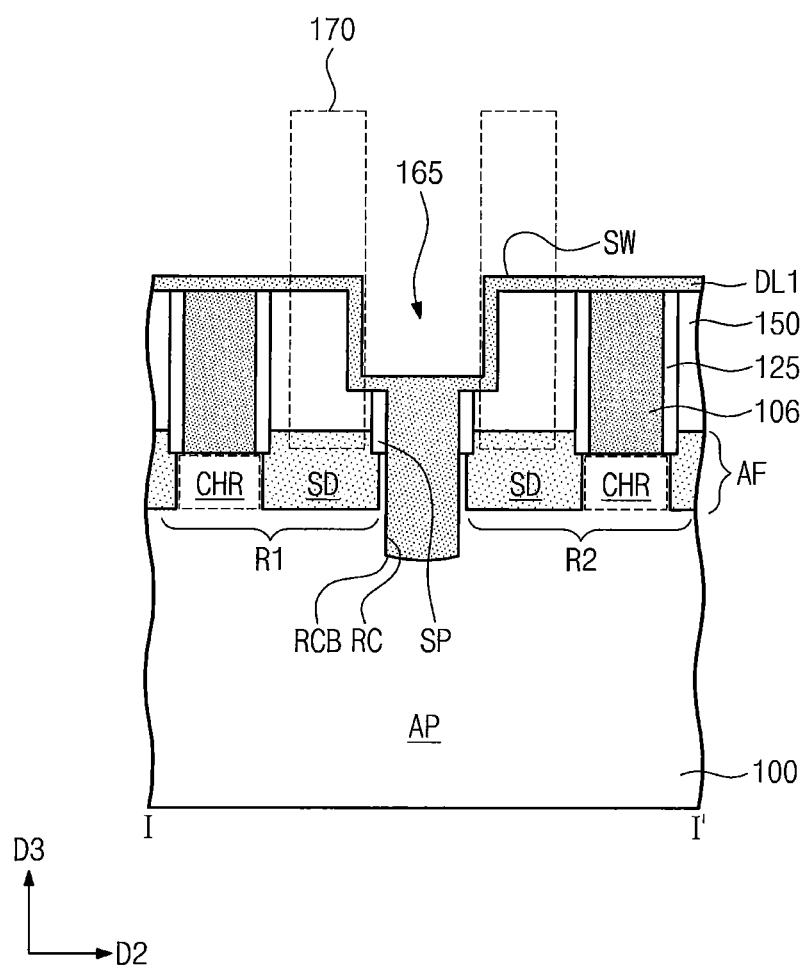
Figure 12B:
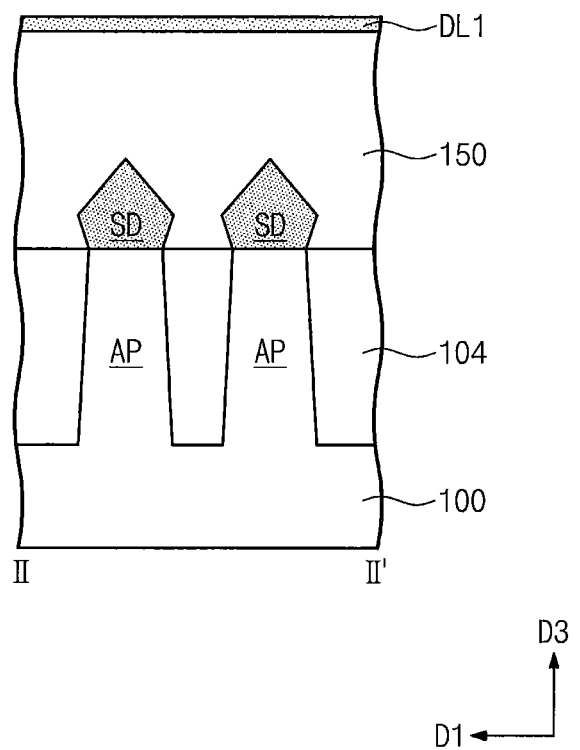
Figure 12C:
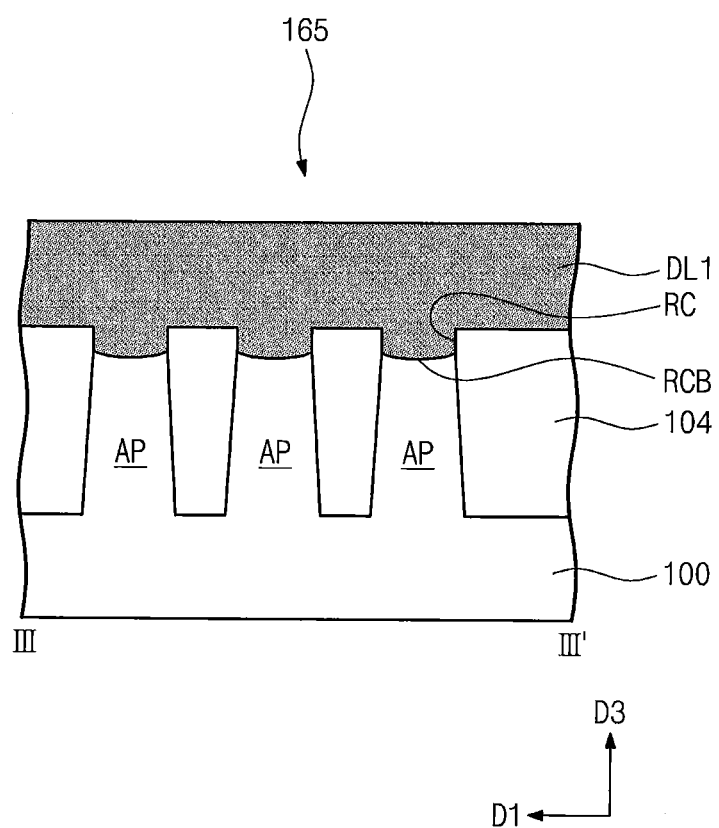
Figure 12D:
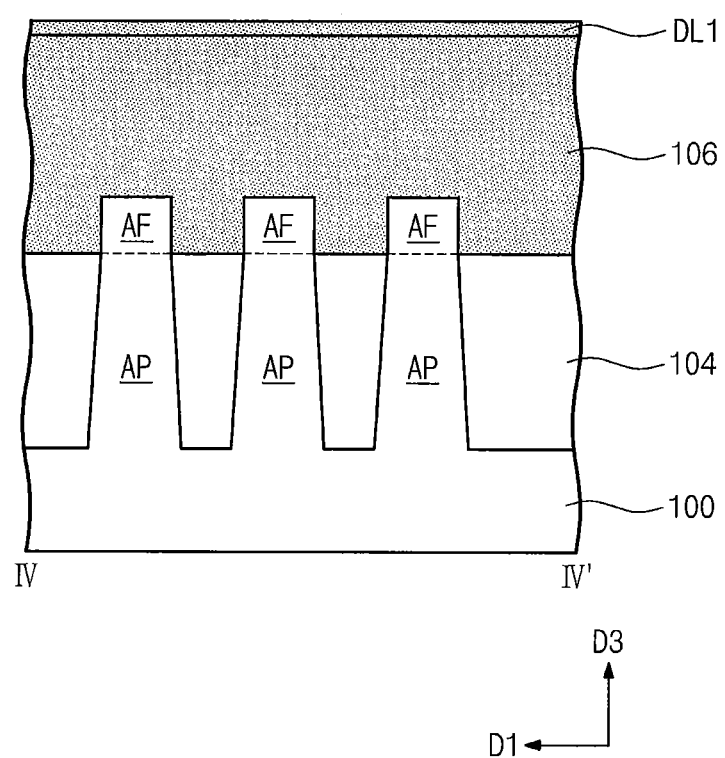

FIGS. 5A to 5B are cross-sectional views illustrating a semiconductor device according to still other example embodiments of the inventive concept. FIG. 5A is a cross-sectional view taken along line I-I' of FIG. 2. FIG. 5B is a cross-sectional view taken along line III-III' of FIG. 2. In the following description, an element previously described with reference to FIGS. 2 and 3A to 3D may be identified by a similar or identical reference number without repeating an overlapping description thereof.

Referring to FIGS. 2, 3B, 3D, 5A and 5B, a separation structure DB may further include a conductive pattern CL which covers a first insulating pattern DP1 and extends in the first direction D1 together with the first insulating pattern DP1. The conductive pattern CL may be interposed between the first and second insulating patterns DP1 and DP2.

A lower width of the conductive pattern CL may be substantially the same as a width W1 of the first insulating pattern DP1, and an upper width of the conductive pattern CL may be substantially the same as a width W2 of the second insulating pattern DP2.

Maximum width (e.g., W2) of the conductive pattern CL in the second direction D2 may be smaller than a distance between a pair of contacts CA adjacent to it. That is, the conductive pattern CL may be spaced apart from the pair of contacts CA. Furthermore, the conductive pattern CL may also be spaced apart from active pattern AP and source/drain regions SD. The conductive pattern CL may include at least one of conductive metal nitride (e.g., titanium nitride or tantalum nitride) and metal material (e.g., titanium, tantalum, tungsten, copper or aluminum).

When viewed in a plan view, one end of the separation structure DB may be connected to one end of any one of the gate electrodes (e.g., gate electrode 135a, see FIG. 2). In this case, the conductive pattern CL may be electrically connected to the gate electrode 135a because the separation structure DB includes the conductive pattern CL. That is, the gate electrode 135a may electrically extend in the first direction D1 across the PMOSFET region through the conductive pattern CL. In example embodiments, although not shown in the drawings, an additional gate contact may be connected to the other end of the separation structure DB. A signal may be applied to the gate electrode 135a by using the gate contact and the separation structure DB. Accordingly, the separation structure DB may serve as a conductive line to apply the signal to the gate electrode as well as to prevent movement of carriers between first and second regions.

FIGS. 6A to 14A, FIGS. 6B to 14B, FIGS. 6C to 14C and FIGS. 10D to 14D are cross-sectional views illustrating a method of manufacturing a semiconductor device according to example embodiments of the inventive concept. FIGS. 6A to 14A are cross-sectional views taken along line I-I' of FIG. 2, FIGS. 6B to 14B are cross-sectional views taken along line II-II' of FIG. 2, FIGS. 6C to 14C are cross-sectional views taken along line III-III' of FIG. 2 and FIGS. 10D to 14D are cross-sectional views taken along line IV-IV' of FIG. 2.

Referring to FIG. 2 and FIGS. 6A to 6C, device isolation trenches 105 may be formed on a substrate 100 to define active patterns AP. The substrate 100 may include a silicon substrate, a germanium substrate, a silicon-germanium substrate or a compound semiconductor substrate. The active patterns AP may be doped with a first conductivity type dopant.

Forming the device isolation trenches 105 may include forming mask patterns on the substrate and anisotropically etching the substrate using the mask patterns as an etch-mask. The mask patterns may include a first mask pattern 110 and a second mask pattern 115 which have an etch selectivity with respect to each other and are sequentially stacked on the substrate. The device isolation trenches 105 may be formed to have aspect ratio of at least about 5. A width of the device isolation trench 105 may be formed to be narrower toward downward. Accordingly, a width of the active pattern AP may be formed to be narrower toward upward.

Referring to FIG. 2 and FIGS. 7A to 7C, device isolation layers 104 may be formed to fill the device isolation trenches 105. Forming the device isolation layer 104 may include filling the device isolation trench 105 with an insulating layer (e.g., silicon oxide), and planarizing the insulating layer to expose a top surface of the first mask pattern 110. Thus, the device isolation layers 104 may be locally formed in the device isolation trenches 105.

Referring to FIG. 2 and FIGS. 8A to 8C, upper regions (hereinafter, it is referred to as an active fin AF) of the active patterns AP may be exposed. Exposing the active fins AF may include recessing an upper portion of the device isolation layers 104 using a wet etching process. The device isolation layer 104 may have an etching selectivity with respect to the active pattern AP. The first mask pattern 110 may be removed during etching the device isolation layer 104. Accordingly, top surfaces of the active fins AF may be exposed.

The sacrificial gate patterns 106 and gate mask patterns 108 may be formed to be sequentially stacked on the active fins AF. Each of the sacrificial gate patterns 106 and the gate mask patterns 108 may be formed in a line shape or a bar shape extending in a first direction D1 and may cross the active fins AF. For example, the sacrificial gate patterns 106 and the gate mask patterns 108 may be formed by patterning a sacrificial gate layer (not shown) and a gate mask layer (not shown) which are sequentially formed on the active fins AF and the device isolation layers 104. The sacrificial gate layer may include a polycrystalline silicon layer, and the gate mask layer may include a silicon nitride layer or a silicon oxynitride layer.

Gate spacers 125 may be formed on the opposite sidewalls of each of the sacrificial gate patterns 106. The gate spacers 125 may be formed by conformally forming a spacer layer to cover the sacrificial gate pattern 106 on the substrate 100 and anisotropically etching the spacer layer. The spacer layer may be formed using at least one of silicon oxide ($SiO_2$), silicon carbide nitride (SiCN), silicon carbide oxynitride (SiCON) and/or silicon nitride (SiN).

Referring to FIG. 2 and FIGS. 9A to 9C, source/drain regions SD may be formed at both sides of each of the sacrificial gate patterns 106. For example, the source/drain regions SD may be formed by a selective epitaxial growth process using the substrate 100 as a seed layer. The selective epitaxial growth process may include a chemical vapor deposition process or a molecular beam epitaxy process.

Firstly, the active fins AF may be selectively etched using the gate mask patterns 108 and the gate spacers 125 as an etch-mask. After etching the active fins AF, the source/drain regions SD may be formed using the exposed active patterns AP as a seed layer. By forming the source/drain regions, Channel regions CHR may be defined between the source/drain regions.

Top surfaces of the source/drain regions may be positioned at a higher level than those of the channel regions CHR. In addition, the top surfaces of the source/drain regions may have a curvature other than zero. For example, the top surface of the source/drain regions SD may be convex upward.

The source/drain regions SD may include a semiconductor element different from the substrate 100. For example, the source/drain regions SD may include the semiconductor element whose lattice constant is greater or smaller than that of the substrate 100. In this case, compressive stress or tensile stress may be created in the channel region CHR because the source/drain regions SD include the semiconductor element different from the substrate 100. As an example, when the substrate 100 is a silicon substrate, the source/drain regions may include silicon-germanium (SiGe) or germanium (Ge). In this case, the compressive stress may be created in the channel region CHR, and a field effect transistor with the source/drain regions SD may preferably be a PMOSFET. In some other examples, when the substrate 100 is a silicon substrate, the source/drain regions may include silicon carbide (SiC). In this case, the tensile stress may be created in the channel region CHR, and a field effect transistor with the source/drain regions SD may preferably be an NMOSFET. A mobility of carriers in the channel regions CHR may be improved by introducing the compressive or tensile stress in the channel regions when the field effect transistor is operated.

The source/drain regions SD may be doped with a second conductivity type dopant different from a first conductivity type of the active patterns AP. For example, the second conductivity type dopants may be in-situ doped when the source/drain regions SD are formed. For other example, after forming the source/drains SD, the second conductivity type dopants may be implanted into the source/drain regions SD.

A first interlayer insulating layer 150 covering the source/drain regions SD may be formed. For example, the first interlayer insulating layer 150 may be formed on the entire region of the substrate 100 to cover the sacrificial gate patterns 106 and the gate mask patterns 108. The first interlayer insulating layer 150 may include a silicon oxide layer, and may be formed by FCVD (Flowable Chemical Vapor Deposition) process.

The first interlayer insulating layer 150 may be planarized until top surfaces of the sacrificial gate patterns 106 are exposed. The planarization of the interlayer insulating layer 150 may be performed by using etch-back or CMP (Chemical Mechanical Polishing) process. The gate mask patterns 108 may be removed by the planarization process, and then the top surfaces of the sacrificial gate patterns 106 may be exposed. Upper portions of the gate spacers 125 may be removed by planarization process. Accordingly, the top surface of the first interlayer insulating layer 150 may be coplanar with the top surfaces of the sacrificial gate patterns 106 and the top surfaces of the gate spacers 125.

Referring to FIG. 2 and FIGS. 10A to 10D, a third mask pattern 160 may be formed on the first interlayer insulating layer 150. The third mask pattern 160 may include an opening 163 exposing a top surface of any one sacrificial gate pattern 106. The opening 163 may define a planar region to form the separation structure DB according to example embodiments of the inventive concept. A width of the opening 163 may be greater than that of the sacrificial gate pattern 106.

The sacrificial gate pattern 106 exposed by the third mask pattern 160 may be removed to form an insulating trench 165. The insulating trench 165 may be formed using an etching process which selectively removes the sacrificial gate pattern 106. The channel regions CHR of the active fins AF may be exposed by the insulating trench 165. The exposed channel regions CHR may be spaced apart from each other in the first direction D1. Furthermore, the top surfaces of the device isolation layers 104 between the channel regions CHR may be exposed. The sacrificial gate patterns 106 covered by the third mask pattern 160 may remain intact.

Referring FIG. 2 and FIGS. 11A to 11D, the channel regions CHR may be selectively etched using the third mask pattern 160 and the gate spacers 125 on opposite sidewalls of the insulating trench 165 as an etch mask. The active fins AF may be divided into two parts by selectively etching the channel regions CHR.

For example, any one active fin AF may be divided into first and second regions R1 and R2, and a recess region RC may be defined between the first and second regions R1 and R2. The recess region RC may be a region where the channel region CHR is selectively removed. A bottom surface RCB of the recess region RC may be positioned at a lower level than the top surface of the device isolation layer 104. Thus, a part of the sidewalls of the recess region RC may be defined by the device isolation layer 104 (refer to FIG. 11C). The recess region RC may be provided in plurality, and may be defined with respect to each of the active patterns AP that are exposed by the insulating trench 165. When the channel regions CHR are selectively etched, a part of the first interlayer insulating layer 150 and a part of the gate spacers 125 may be etched together, at the same time. Thus, a width of an upper portion of the insulating trench 165 may be further increased. For example, the width of the upper portion of the insulating trench 165 may be substantially the same as the width of the opening 163. Separation spacers SP may be formed by removing the upper portions of the gate spacers 125. The separation spacers SP may be lower portions of the gate spacers 125.

Referring to FIG. 2 and FIGS. 12A to 12D, firstly, the third mask pattern 160 may be removed. Then, a first insulating layer DL1 may be formed to completely fill the recess region RC. The first insulating layer DL1 may partially fill the insulating trench 165. The first insulating layer DL1 may cover top surfaces of the separation spacers and sidewalls of the insulating trench 165.

The first insulating layer DL1 may include a nitride layer. For example, the first insulating layer DL1 may include silicon carbide nitride (SiCN), silicon carbide oxynitride (SiCON) and/or silicon nitride (SiN). The first insulating layer DL1 may be formed by PVD (Physical Vapor Deposition) or CVD (Chemical Vapor Deposition) techniques.

Referring back to FIG. 12A, a region to form a contact hole 170, which will be described later, is shown by a dotted line. The region to form the contact hole 170 may be overlapped with a part SW of the first insulating layer DL1. Thus, the part SW of the first insulating layer DL1 may affect the formation of the contact hole 170. The first insulating layer DL1 may include the nitride layer having a etch selectivity with respect to the first interlayer insulating layer 150 and a second interlayer insulating layer 155 which will be described later. Accordingly, in an etching process for the formation of the contact holes, the contact holes 170 may not be fully formed. Ultimately, it may lead to device reliability problems.

Referring to FIG. 2 and FIGS. 13A to 13D, a first insulating pattern DP1 may be formed by removing the part SW of the first insulating layer DL1. The first insulating layer DL1 partially filling the insulating trench 165 may be selectively removed using dry etching process. An etching of the first insulating layer DL1 may be performed until a top surface of the first insulating layer DL1 is positioned at a lower level than top surfaces of the separation spacers SP.

The first insulating pattern DP1 may completely fill the recess regions RC. When viewed in a cross-sectional view along the first direction D1, the first insulating pattern DP1 may have a comb shape (refer to FIG. 13C). In conclusion, the first insulating pattern DP1 may penetrate the active fins AF, and may be formed to have a line shape extending in the first direction D1.

Figure 13A:
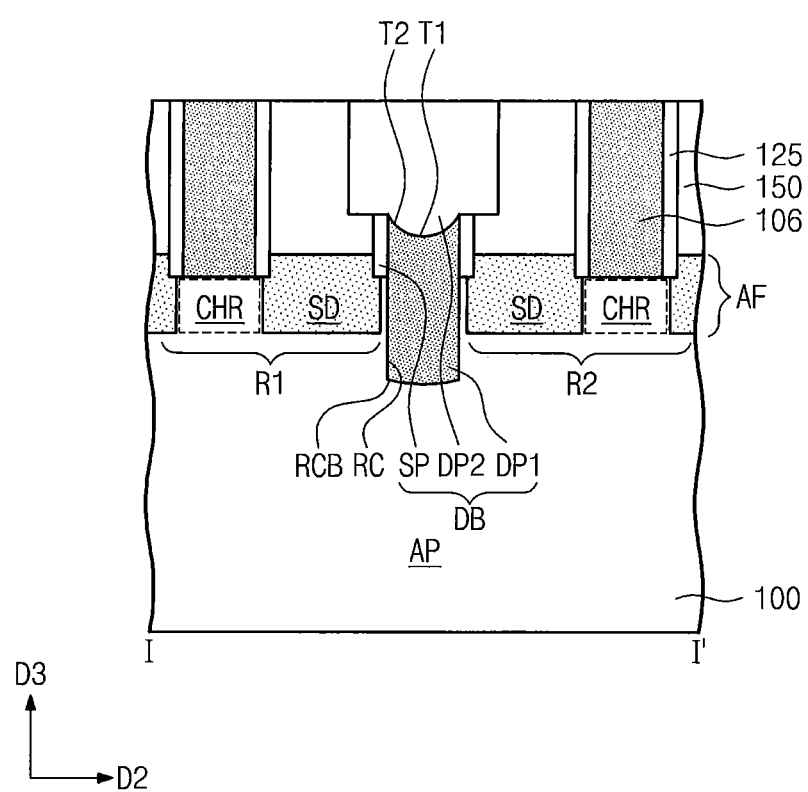
Figure 13B:
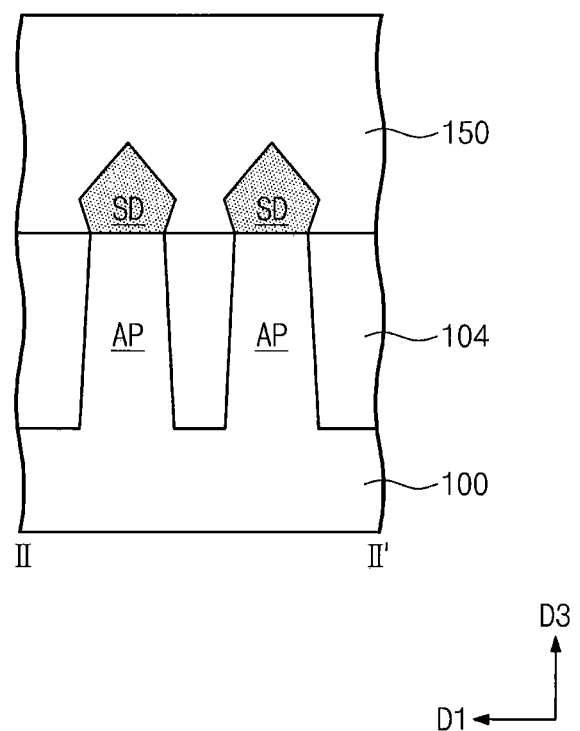
Figure 13C:
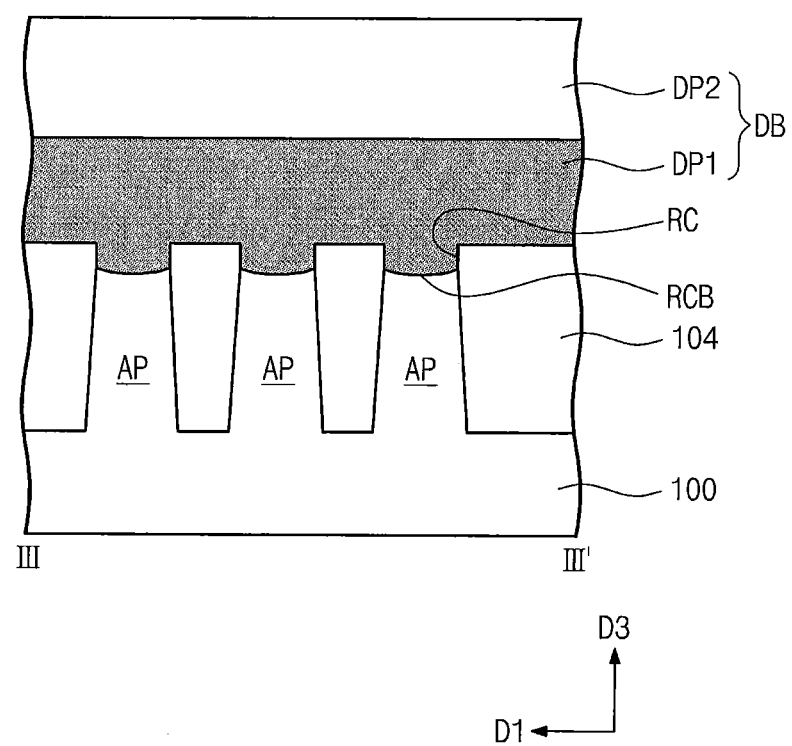
Figure 13D:
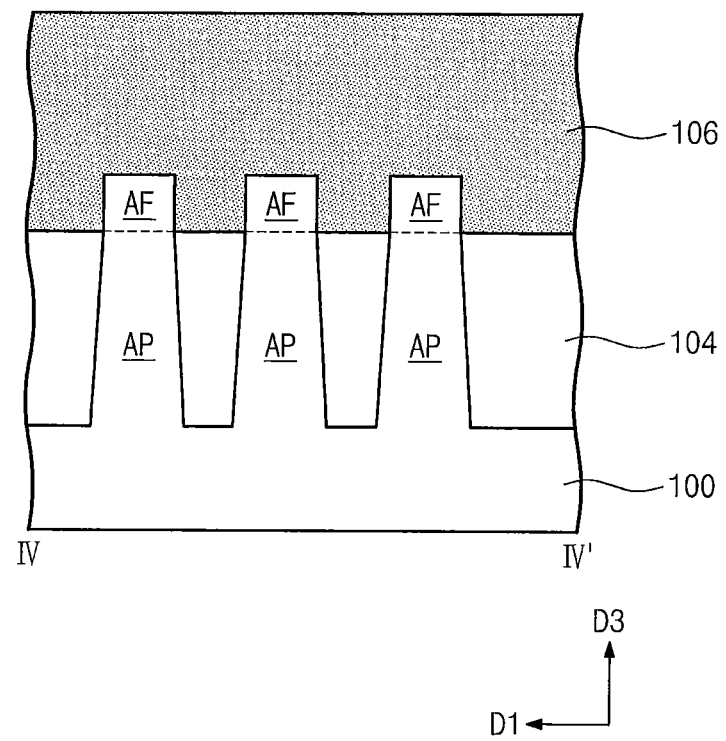
Figure 14A:
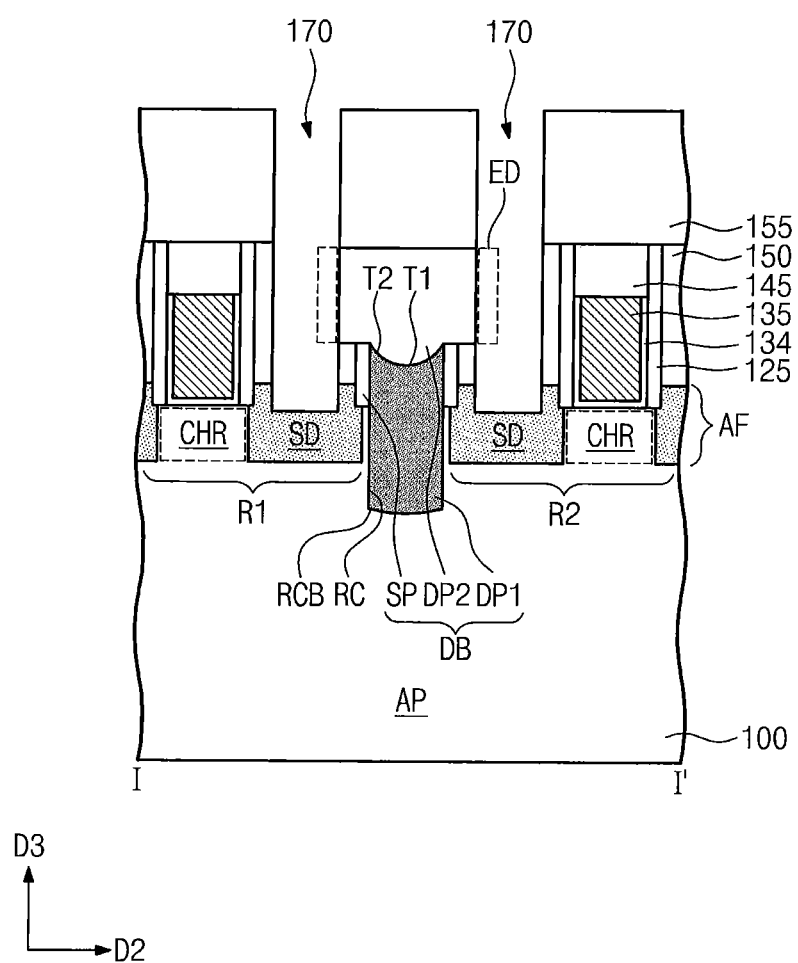
Figure 14B:
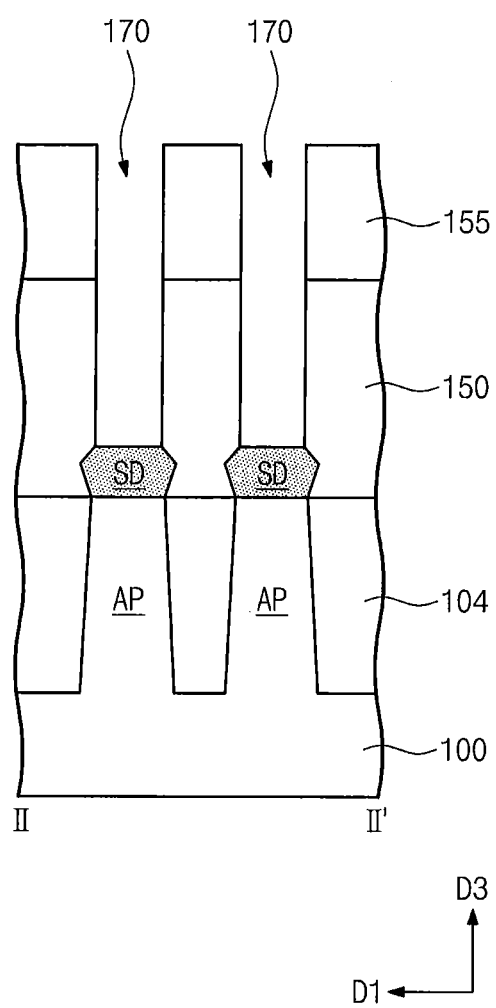
Figure 14C:
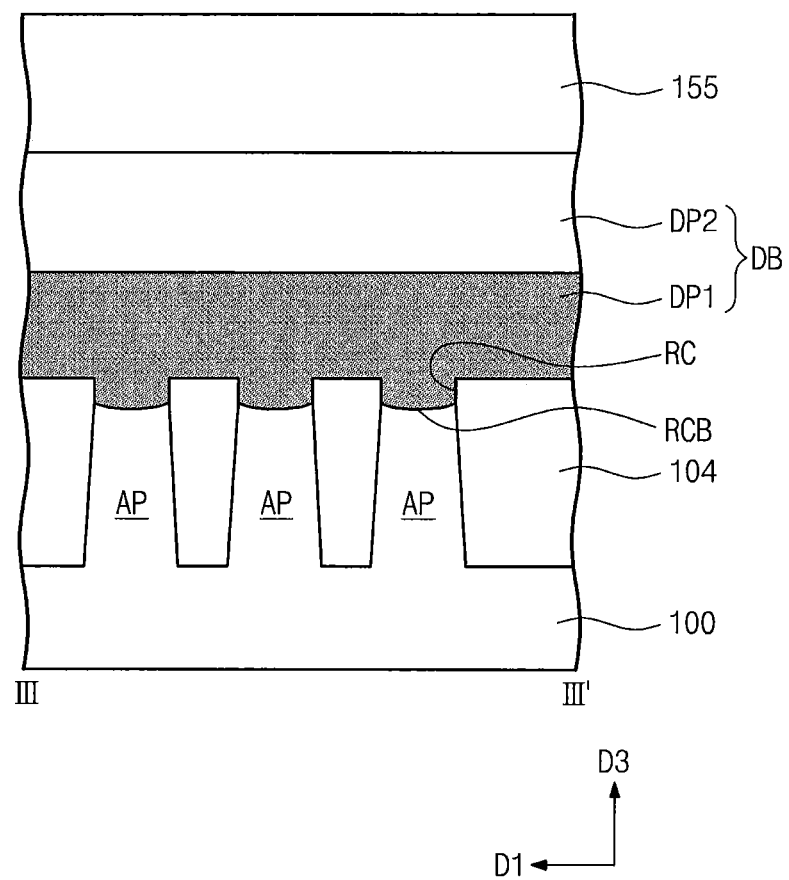
Figure 14D:
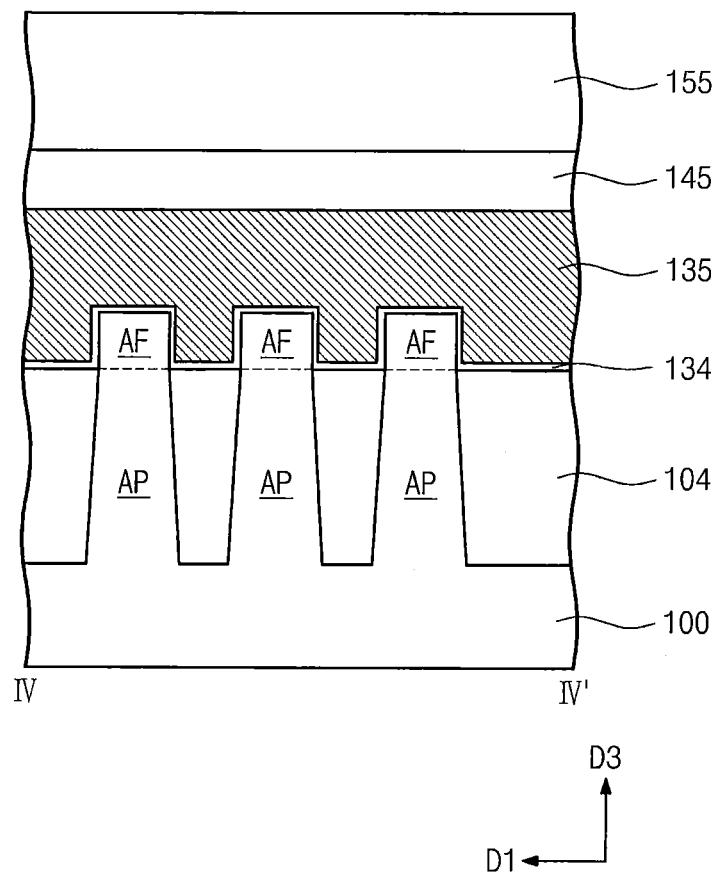

After etching the first insulating pattern DP1, when viewed in a cross-sectional view along the second direction D2, the first insulating pattern DP1 may have a concave top surface (refer to FIG. 13A). More specifically, the top surface of the first insulating pattern DP1 may have a curved concave-shaped surface. A center portion of the first insulating layer DL1 may be more etched during removing a part of the first insulating layer DL1 which covers top surfaces of the separation spacers SP and sidewalls of the insulating trench 165. As an example, a center T1 of the top surface of the first insulating pattern DP1 may be positioned at a lower level than both edges T2 of the top surface of the first insulating pattern DP1. The both edges T2 of the top surface of the first insulating pattern DP1 may be positioned at substantially the same level as the top surfaces of the separation spacers SP. The center T1 of the top surface of the first insulating pattern DP1 may be positioned at a lower level than the top surfaces of the separation spacers SP. The second insulating pattern DP2 may be formed to cover the first insulating pattern DP1. Forming the second insulating pattern DP2 may include forming a second insulating layer covering the first insulating pattern DP1 and the first interlayer insulating layer 150, and planarizing the second insulating layer until top surfaces of the remaining sacrificial gate patterns 106 are exposed. Thus, a top surface of the second insulating pattern DP2 may be coplanar with the top surface of the first interlayer insulating layer 150.

The second insulating layer may be formed using at least one of silicon oxide ($SiO_2$), silicon carbide nitride (SiCN), silicon carbide oxynitride (SiCON) and/or silicon nitride (SiN). For example, the second insulating layer may include the same silicon oxide layer as the first interlayer insulating layer 150. However, the second insulating layer may include a material different from the first insulating pattern DP1.

The first and second insulating patterns DP1 and DP2 and the separation spacers SP may extend together in the first direction D1. The first and second insulating patterns DP1 and DP2 and the separation spacers SP may constitute a separation structure DB.

Referring to FIG. 2 and FIGS. 14A to 14D, the remaining sacrificial gate patterns 106 may be replaced with gate structures. Each of the gate structures may include a gate dielectric layer 134, a gate electrode 135 and a gate capping layer 145.

Firstly, the sacrificial gate patterns 106 may be removed to form gate trenches. The gate trenches may be formed by an etching process which selectively removes the sacrificial gate patterns 106. The channel region CHR of the active fin AF may be exposed by the gate trench.

The gate dielectric layer 134 and the gate electrode 135 may be formed in each of the gate trenches. The gate dielectric layer 134 may be conformally formed in the gate trench. The gate dielectric layer 134 may be formed by ALD (Atomic Layer Deposition) or a chemical oxidation process. The gate dielectric layer 134 may include a high-k dielectric material. The high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide and/or lead zinc niobate.

The gate electrode layer may be formed on the gate dielectric layer 134 to fill the gate trench, and then the gate electrode layer and the gate dielectric layer 134 may be planarized until a top surface of the first interlayer insulating layer 150 is exposed. Accordingly, the gate dielectric layer 134 and the gate electrode 135 may be locally formed in the gate trench. The gate dielectric layer 134 and the gate electrode 135 may extend in the first direction D1. The gate electrode layer may include at least one of conductive metal nitride (e.g., titanium nitride or tantalum nitride) and metal material (e.g., titanium, tantalum, tungsten, copper or aluminum). The gate electrode layer may be formed by a deposition process such as a CVD or sputtering process. A planarization process of the gate electrode layer and the gate dielectric layer may include a CMP process.

Upper portions of the gate electrodes 135 may be recessed, and the capping layers 145 may be forms on the gate electrodes 135, respectively. More specifically, the portions of the gate electrodes 135 may be removed by a selective etching process. Thus, top surfaces of the gate electrodes 135 may be positioned at a lower level than the top surface of the first interlayer insulating layer 150. In example embodiments, a part of the gate dielectric layer 134 positioned at a higher level than the top surface of the gate electrode 135 may be removed after the upper portion of the gate electrode 135 is recessed. The gate dielectric layer 134 may be disposed between the gate electrode 135 and the active fin AF, and between the gate electrode 135 and the gate spacer 125.

The gate capping layers 145 may be formed on the recessed gate electrodes 135, respectively. The gate capping layers 145 may be formed to completely fill the recessed regions of the gate electrodes 135. The gate capping layers 145 may be formed of a material with etch selectivity with respect to the first interlayer insulating layer 150 and a second interlayer insulating layer 155 which will be described later. For example, the gate capping layers 145 may include at least one of silicon oxynitride (SiON), silicon carbide nitride (SiCN), silicon carbide oxynitride (SiCON) and/or silicon nitride (SiN). The gate capping layers 145 may be formed by ALD, plasma enhanced CVD or high density plasma CVD.

A second interlayer insulating layer 155 may be formed on the first interlayer insulating layer 150, the second insulating pattern DP2 and the gate capping layer 145. The second interlayer insulating layer 155 may include a silicon oxide layer and/or a low-k oxide layer. As an example, the low-k oxide layer may include a silicon oxide layer doped with carbon such as SiCOH. The second interlayer insulating layer 155 may be formed by CVD process.

Contact holes 170 may be formed to penetrate the second and first interlayer insulating layers 155 and 150 and expose the source/drain regions SD. The contact holes 170 may be self-aligned by the gate capping layers 145 and the gate spacers 125. The contact holes 170 may be formed by performing an anisotropic etching process using a photoresist pattern (not shown) as a etch mask. The photoresist pattern (not shown) may include openings (not shown) corresponding to the contact holes 170.

While forming the contact holes, upper portions of the source/drain regions SD may be partially etched. Accordingly, the upper portions of the source/drain regions SD may be recessed.

The contact holes 170 adjacent the separation structure DB may penetrate both edge portions ED of the second insulating pattern DP2 as well as the first and second interlayer insulating layer 150 and 155. However, the contact holes 170 may be fully formed without causing a problem of an etch selectivity because the second insulating pattern DP2 includes the same material as the first interlayer insulating layer 150. That is, as described previously, a reliability of the device may be improved by removing a part of the first insulating layer DL1.

In example embodiments, although not shown, silicide layers (not shown) may be formed on the source/drain regions SD exposed by the contact holes 170. Forming the silicide layer may include forming a metal layer on the source/drain regions SD and forming a metal-silicide layer by performing a heat treatment on the metal layer. The silicide layer may include at least one of titanium silicide, tantalum silicide and/or tungsten silicide.

In example embodiments, although not shown, contact spacers (not shown) may be formed to cover sidewalls of the contact holes 170. Forming the contact spacers may include conformally forming a spacer layer so as not to completely fill the contact holes 170 and forming the contact spacers in the contact holes 170 by anisotropically etching the spacer layer.

Referring back to FIG. 2 and FIGS. 3A to 3D, contacts CA may be formed in the contact holes 160. Each of the contacts CA may include a conductive pillar CP and a barrier layer BL surrounding the conductive pillar CP. More specifically, the barrier layer BL may be formed to partially fill the contact holes 170. Then, a conductive layer may be formed to completely fill the contact holes 170 and a planarization process may be performed until a top surface of the second interlayer insulating layer 155. The barrier BL may include metal nitride, for example, titanium/titanium nitride. The conductive layer may include metal, for example, tungsten.

FIGS. 5A and 5B are cross-sectional views illustrating a method of manufacturing a semiconductor device according to other example embodiments of the inventive concept. FIGS. 5A and 5B are the cross-sectional views taken along the lines I-I' and III-III' of FIG. 2. In the following description, an element previously described with reference to FIGS. 6A to 14A, FIGS. 6B to 14B, FIGS. 6C to 14C and FIGS. 10D to 14D may be identified by a similar or identical reference number without repeating an overlapping description thereof.

Referring back to FIGS. 2, 3B, 3D, 5A and 5B, a conductive pattern CL may be interposed between the first and second insulating patterns DP1 and DP2. More specifically, before forming the second insulating pattern DP2 previously described with reference to FIGS. 2 and 13A to 13D, the conductive pattern CL may be formed to cover the first insulating pattern DP1. Forming the conductive pattern CL may include forming a conductive layer filling the insulating trench 165 and etching an upper portion of the conductive layer. Thus, the conductive pattern CL may partially fill the insulating trench 165. The second insulating pattern DP2 may be formed to cover the conductive pattern CL. The conductive layer may include at least one of conductive metal nitride (e.g., titanium nitride or tantalum nitride) and metal material (e.g., titanium, tantalum, tungsten, copper and/or aluminum).

Figure 15:
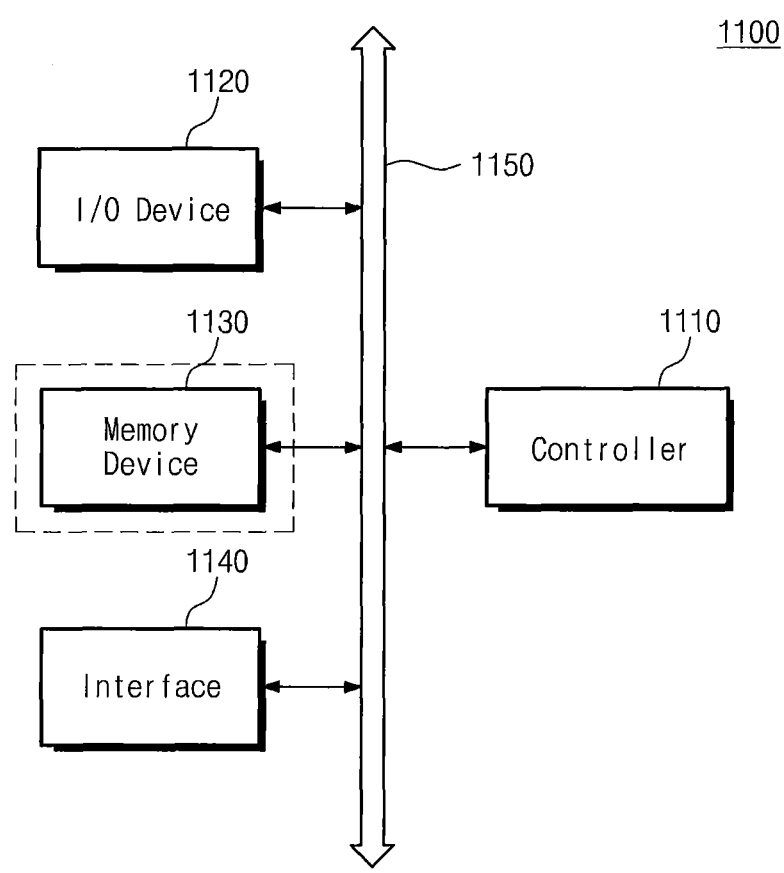
FIG. 15 is a schematic block diagram illustrating an example of electronic systems including a semiconductor device according to example embodiments of the inventive concept.

FIG. 15 is a schematic block diagram illustrating an example of electronic systems including a semiconductor device according to example embodiments of the inventive concept.

Referring to FIG. 15, an electronic system 1100 according to example embodiments of the inventive concept may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other similar logic devices. The I/O unit 1120 may include a keypad, a keyboard or a display unit. The memory device 1130 may store data and/or commands. The memory device 1130 may include a nonvolatile memory device such as a flash memory device, a phase change memory device and/or a magnetic memory device. In addition, the memory device 1130 may further include a volatile memory device. In this case, the memory device 1130 may include a SRAM (Static Random Access Memory) device including a semiconductor device according to example embodiments of the inventive concept. The interface unit 1140 may transmit electrical data to a communication network and/or may receive electrical data from a communication network. The interface unit 1140 may operate in a wireless and/or wired manner. For example, the interface unit 1140 may include an antenna for the wireless communication and/or a transceiver for the wired and/or wireless communication. Although not shown in the drawings, the electronic system 1100 may further include a fast DRAM device and/or a fast SRAM device that acts as a cache memory for improving an operation of the controller 1110. The semiconductor device according to example embodiments of the inventive concept may be provided as a part of the controller 1110 and/or the I/O unit 1120.

Figure 16:
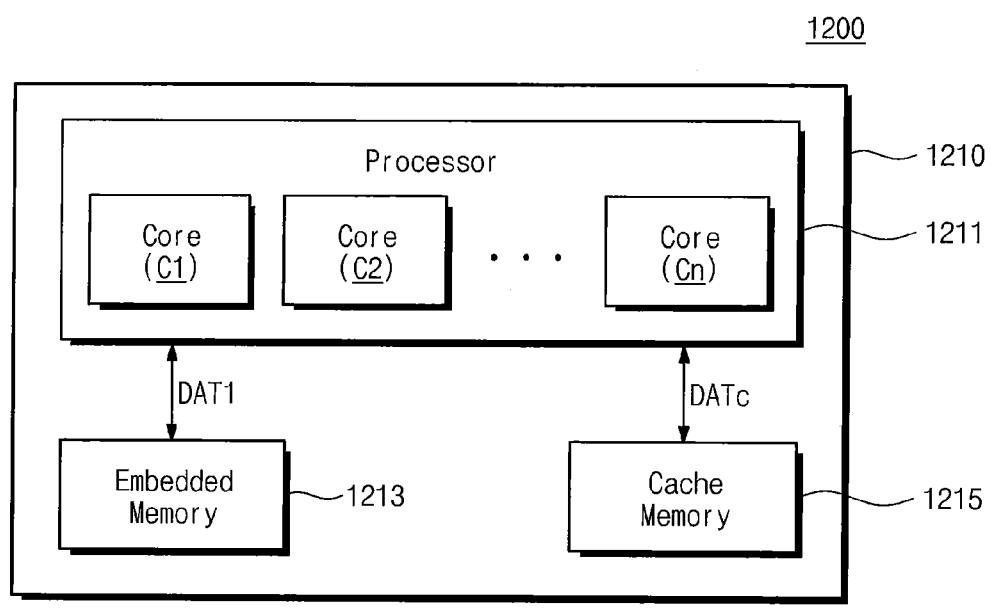
FIG. 16 is a block diagram showing the configuration of an electronic device including the semiconductor device according to example embodiments of the inventive concept.

FIG. 16 is a block diagram showing the configuration of an electronic device including the semiconductor device according to example embodiments of the inventive concept.

Referring to FIG. 16, the electronic device 1200 may include a semiconductor chip 1210. The semiconductor chip 1210 may include a processor 1211, an embedded memory 1213 and a cache memory 1215.

The processor 1211 may include one or more processor cores C1-Cn. The one or more processor cores C1-Cn may process a data and a signal. The processor cores C1-Cn may include a semiconductor device in accordance with embodiments of the inventive concept and for example, a plurality of logic cells illustrating with reference to FIG. 1.

The electronic device 1200 may perform a specific function using the processing data and the signal. The processor 1211 may be an application processor.

The embedded memory 1213 may exchange a first data DAT1 with the processor 1211. The first data DAT1 may be the data being processed or to be processed by the one or more processor cores C1-Cn. The embedded memory 1213 may manage the first data DAT1. For example, the embedded memory 1213 may buffer the first data DAT1. That is, the embedded memory 1213 may operate as a buffer memory or a working memory of the processor 1211.

According to an embodiment of the inventive concept, the electronic device 1200 may be applied to a wearable device.

The embedded memory 1213 may be a SRAM (Static Random Access Memory). The SRAM may operate at a faster speed than a DRAM (Dynamic Random Access Memory). When the SRAM is embedded in the semiconductor chip 1210, the electronic device 1200 may have a small size and may operate at a high speed. The SRAM may include the semiconductor device according to embodiments of the inventive concept.

The cache memory 1215 with the one or more processor cores C1 through Cn may be mounted on the semiconductor chip 1210. The cache memory 1215 may storage a cache data DATc. The cache data DATc may be a data using the one or more processor cores C1 through Cn. The cache memory 1215 may include SRAM (Static Random Access Memory) including the semiconductor device according to embodiments of the inventive concept.

For ease of understanding, in FIG. 16, the cache memory 1215 is shown as a separate component. But the processor 1211 may be configured to include the cache memory 1215. FIG. 16 is not limited the scope of the inventive concept.

The processor 1211, the embedded memory 1213 and the cache memory 1215 may transmit a data based on a variety of interface protocols. For example, the processor 1211, the embedded memory 1213 and the cache memory 1215 may transmit the data based on at least one of USB (Universal Serial Bus), SCSI (Small Computer System Interface), PCI (Peripheral Component Interconnect) Express, ATA (Advanced Technology Attachment), PATA (Parallel ATA), SATA (Serial ATA), SAS (Serial Attached SCSI), IDE (Integrated Drive Electronics), UFS (Universal Flash Storage).

Figure 17:
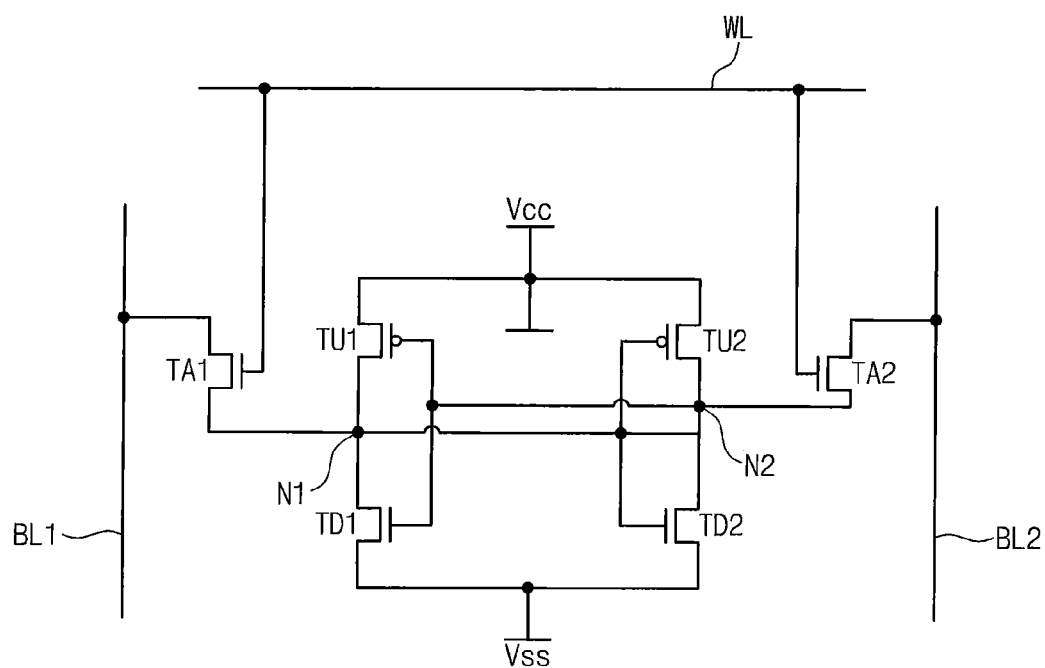
FIG. 17 is a circuit diagram of a SRAM cell according to example embodiments of the inventive concept.

FIG. 17 is a circuit diagram of a SRAM cell according to example embodiments of the inventive concept. The SRAM cell may be applied to the embedded memory 1213 and/or the cache memory 1215 illustrating in FIG. 16.

Referring to FIG. 17, the SRAM cell may include a first pull-up transistor TU1, a first pull-down transistor TD1, a second pull-up transistor TU2, a second pull-down transistor TD2, a first access transistor TA1 and a second access transistor TA2. The first and second pull-up transistors TU1 and TU2 may be PMOS transistors, and the first and second pull-down transistors TD1 and TD2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line Vcc and a second source/drain of the first pull-down transistor TD1 may be connected to a ground line Vss. A gate of the first pull-up transistor TU1 and a gate of the first pull-down transistor TD1 may be electrically connected to each other. Thus, the first pull-up transistor TU1 and the first pull-down transistor TD1 may constitute a first inverter. The gates of the first pull-up and pull down transistors TU1 and TD1 connected to each other may correspond to an input of the first inverter, and the first node may correspond to an output of the first inverter.

A first source/drain of the second pull-up transistor TU2 and a first source/drain of the second pull-down transistor TD2 may be connected to a second node N2. A second source/drain of the second pull-up transistor TU2 may be connected to a power line Vcc and a second source/drain of the second pull-down transistor TD2 may be connected to a ground line Vss. A gate of the second pull-up transistor TU2 and a gate of the second pull-down transistor TD2 may be electrically connected to each other. Thus, the second pull-up transistor TU2 and the second pull-down transistor TD2 may constitute a second inverter. The gates of the second pull-up and pull down transistors TU2 and TD2 connected to each other may correspond to an input of the second inverter, and the second node may correspond to an output of the second inverter.

The first and second inverters coupled to each other may constitute a latch structure. That is, the gates of the first pull-up and pull-down transistors TU1 and TD1 may be electrically connected to the second node N2, and the gates of the second pull-up and pull-down transistors TU2 and TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. The gates of the first and second access transistors TA1 and TA2 may be connected to a word line WL. Thus, the SRAM cell in accordance with embodiments of the inventive concept may be implemented.

Figure 18:
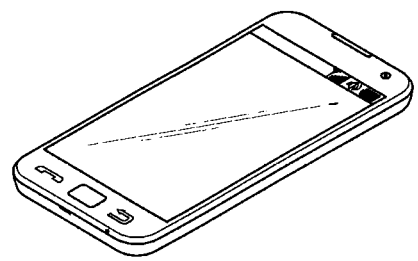
FIGS. 18 to 20 are perspective views illustrating multimedia devices including semiconductor devices according to example embodiments of the inventive concept.
Figure 19:
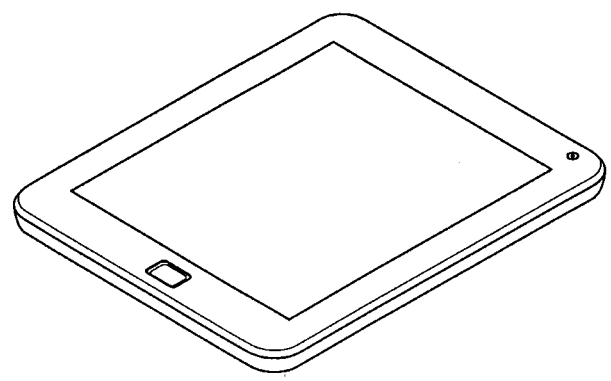
Figure 20:
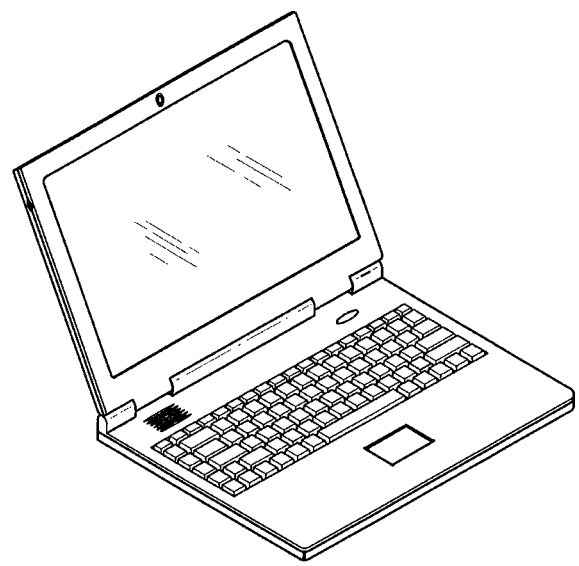

FIGS. 18 to 20 are perspective views illustrating multimedia devices including semiconductor devices according to example embodiments of the inventive concept. The electronic system 1100 of FIG. 15 and/or the electronic device 1200 of FIG. 16 may be applied to a mobile phone or a smart phone 2000 shown in FIG. 18, may be applied to a tablet or a smart tablet 3000 shown in FIG. 19, and may be applied to a notebook computer 4000 shown in FIG. 20.

Although the present inventive concept has been described in connection with the embodiments of the present inventive concept illustrated in the accompanying drawings, it is not limited thereto. It will be apparent to those skilled in the art that various substitutions, modification and changes may be made thereto without departing from the scope and spirit of the inventive concept.

What is claimed is:

1. A semiconductor device comprising:
a substrate including an active pattern;
a device isolation layer that defines the active pattern on the substrate; and
a separation structure that crosses the active pattern and that divides the active pattern into first and second regions,
wherein the separation structure includes a first insulating pattern in a recess region that is between the first and second regions,
wherein the first insulating pattern has a concave top surface, and
wherein the first insulating pattern extends on the device isolation layer along a first direction that is parallel to a top surface of the substrate.

2. The semiconductor device of claim 1,
wherein a center of the concave top surface of the first insulating pattern is positioned at a lower level than both edges thereof.

3. The semiconductor device of claim 1,
wherein the separation structure further includes a second insulating pattern that is on the first insulating pattern.

4. The semiconductor device of claim 3,
wherein the second insulating pattern is on the concave top surface of the first insulating pattern, and
wherein an upper width of the second insulating pattern is greater than a width of the first insulating pattern.

5. The semiconductor device of claim 3, further comprising an interlayer insulating layer on the active pattern on the substrate,
wherein a top surface of the second insulating pattern is coplanar with a top surface of the interlayer insulating layer.

6. The semiconductor device of claim 3, further comprising contacts that are adjacent the separation structure and that are electrically connected to each of the first and second regions,
wherein the contacts penetrate both edges of the second insulating pattern.

7. The semiconductor device of claim 1,
wherein an upper portion of the active pattern protrudes on the device isolation layer, and
wherein a bottom surface of the recess region is positioned at a lower level relative to the substrate than a top surface of the device isolation layer.

8. The semiconductor device of claim 1, further comprising first and second gate electrodes that cross the first and second regions, respectively,
wherein the separation structure extends in parallel between the first and second gate electrodes.

9. The semiconductor device of claim 8,
wherein the concave top surface of the first insulating pattern is positioned at a lower level than top surfaces of the first and second gate electrodes and is positioned at a higher level than a top surface of the active pattern.

10. The semiconductor device of claim 1,
wherein the separation structure further comprises spacers on opposite sidewalls of the first insulating pattern, and
wherein a center of the concave top surface of the first insulating pattern is positioned at a lower level than top surfaces of the spacers.

11. The semiconductor device of claim 10,
wherein a bottom surface of the first insulating pattern is at a lower level relative to the substrate than bottom surfaces of the spacers, and
Wherein the spacers are on the opposite sidewalls of the first insulating pattern.

12. The semiconductor device of claim 1,
wherein the separation structure further comprises a conductive pattern on the first insulating pattern.

13. The semiconductor device of claim 12, wherein the active pattern comprises a plurality of active patterns,
   wherein the device further comprises a third gate electrode that crosses at least one of the active patterns,
   wherein the third gate electrode is aligned in one direction with the separation structure, and the one direction is an extending direction of the third gate electrode and the separation structure, and
   wherein one end of the conductive pattern is connected to one end of the third gate electrode.

14. A semiconductor device comprising:
   a device isolation layer that defines active patterns on a substrate;
   gate electrodes that cross the active patterns and extend on the device isolation layer; and
   a separation structure that crosses the active patterns between a pair of the gate electrodes and extends on the device isolation layer,
   wherein the separation structure includes a first insulating pattern and a second insulating pattern on the first insulating pattern,
   wherein the first insulating pattern penetrates the active patterns and extends toward a bottom surface of the substrate,
   wherein a lowermost portion of a top surface of the first insulating pattern is positioned at a lower level than top surfaces of the gate electrodes, and is positioned at a higher level than top surfaces of the active patterns.

15. The semiconductor device of claim 14, wherein the semiconductor device further comprises spacers on opposite sidewalls of the first insulating pattern, wherein respective ones of the spacers are between the first insulating pattern and adjacent portions of ones of the active patterns, and
   wherein an upper width of the second insulating pattern is greater than a distance between the opposite sidewalls of the first insulating pattern.

16. A semiconductor device comprising:
   a separation structure comprising:
   a first insulating pattern in a recess region of a substrate that is between first and second regions of an active pattern, the first insulating pattern including a concave top surface;
   a second insulating pattern that is on the first insulating pattern, wherein an upper width of the second insulating pattern is greater than a distance between opposite sidewalls of the first insulating pattern; and
   spacers on the opposite sidewalls of the first insulating pattern such that respective portions of the opposite sidewalls of the first insulating pattern are between the spacers, wherein respective ones of the spacers are between the first insulating pattern and respective ones of the first and second regions of the active pattern.

17. The semiconductor device of claim 16,
   wherein a center of the concave top surface of the first insulating pattern is positioned at a lower level than both edges thereof; and
   wherein the second insulating pattern is on the concave top surface of the first insulating pattern.

18. The semiconductor device of claim 16, further comprising a device isolation layer that defines the active pattern on the substrate,
   wherein the first insulating pattern extends on the device isolation layer along a first direction that is parallel to a top surface of the substrate,
   wherein an upper portion of the active pattern protrudes on the device isolation layer, and
   wherein a bottom surface of the recess region is positioned at a lower level relative to the substrate than a top surface of the device isolation layer.

19. The semiconductor device of claim 16, wherein the separation structure is between a first gate electrode and a second gate electrode, and
   wherein the concave top surface of the first insulating pattern is positioned at a lower level than top surfaces of the first and second gate electrodes and is positioned at a higher level than a top surface of the active pattern.

20. The semiconductor device of claim 16, wherein a center of the concave top surface of the first insulating pattern is positioned at a lower level than top surfaces of the spacers.

* * * * *